US007814280B2

(12) United States Patent
Cummings et al.

(10) Patent No.: US 7,814,280 B2
(45) Date of Patent: Oct. 12, 2010

(54) SHARED-MEMORY SWITCH FABRIC ARCHITECTURE

(75) Inventors: Uri Cummings, Santa Monica, CA (US); Andrew Lines, Malibu, CA (US); Patrick Pelletier, Agoura Hills, CA (US); Robert Southworth, Chatsworth, CA (US)

(73) Assignee: Fulcrum Microsystems Inc., Calabasas, CA (US)

( * ) Notice: Subject to any disclaimer, the term of this patent is extended or adjusted under 35 U.S.C. 154(b) by 229 days.

(21) Appl. No.: 11/208,451

(22) Filed: Aug. 18, 2005

(65) Prior Publication Data

US 2006/0155938 A1    Jul. 13, 2006

Related U.S. Application Data

(60) Provisional application No. 60/643,794, filed on Jan. 12, 2005.

(51) Int. Cl.
    *G06F 12/00* (2006.01)
(52) U.S. Cl. .................. 711/147; 711/148; 711/149; 710/29; 710/30; 710/52; 710/317; 370/358; 370/359; 370/360
(58) Field of Classification Search ......... 711/147–149; 710/29, 30, 52, 317; 370/358–360
    See application file for complete search history.

(56) References Cited

U.S. PATENT DOCUMENTS 4,680,701 A    7/1987  Cochran (Continued)

FOREIGN PATENT DOCUMENTS

WO    WO9207361    4/1992

(Continued)

OTHER PUBLICATIONS

[1] Martin, "Compiling Communicating Processes into Delay-Insensitive VLSI Circuits", Dec. 31, 1985, Department of Computer Science California Institute of Technology, Pasadena, California, pp. 1-16.

(Continued)

*Primary Examiner*—Sanjiv Shah
*Assistant Examiner*—Arpan P. Savla
(74) *Attorney, Agent, or Firm*—Weaver Austin Villeneuve and Sampson LLP

(57) ABSTRACT

A shared memory is described having a plurality of receive ports and a plurality of transmit ports characterized by a first data rate. A memory includes a plurality of memory banks organized in rows and columns. Operation of the memory array is characterized by a second data rate. Non-blocking receive crossbar circuitry is operable to connect any of the receive ports with any of the memory banks. Non-blocking transmit crossbar circuitry is operable to connect any of the memory banks with any of the transmit ports. Buffering is operable to decouple operation of the receive and transmit ports at the first data rate from operation of the memory array at the second data rate. Scheduling circuitry is operable to control interaction of the ports, crossbar circuitry, and memory array to effect storage and retrieval of the data segments in the shared memory. The scheduling circuitry is further operable to facilitate striping of each data segment of a frame across the memory banks in one of the rows, and to facilitate striping of successive data segments of the frame across successive rows in the array.

39 Claims, 10 Drawing Sheets

U.S. PATENT DOCUMENTS

| | | | |
|---|---|---|---|
| 4,875,224 A | 10/1989 | Simpson | |
| 4,912,348 A | 3/1990 | Maki et al. | |
| 5,367,638 A | 11/1994 | Niessen et al. | |
| 5,434,520 A | 7/1995 | Yetter et al. | |
| 5,440,182 A | 8/1995 | Dobbelaere | |
| 5,479,107 A | 12/1995 | Knauer | |
| 5,572,690 A | 11/1996 | Molnar | |
| 5,666,532 A | 9/1997 | Saks et al. | |
| 5,732,233 A | 3/1998 | Klim et al. | |
| 5,752,070 A | 5/1998 | Martin et al. | |
| 5,802,331 A | 9/1998 | Van Berkel | |
| 5,864,539 A | 1/1999 | Yin | |
| 5,889,979 A | 3/1999 | Miller, Jr. et al. | |
| 5,894,481 A * | 4/1999 | Book | 370/412 |
| 5,918,042 A | 6/1999 | Furber | |
| 5,920,899 A | 7/1999 | Chu | |
| 5,949,259 A | 9/1999 | Garcia | |
| 5,973,512 A | 10/1999 | Baker | |
| 6,009,078 A | 12/1999 | Sato | |
| 6,038,656 A | 3/2000 | Martin et al. | |
| 6,152,613 A | 11/2000 | Martin et al. | |
| 6,160,813 A * | 12/2000 | Banks et al. | 370/422 |
| 6,289,021 B1 | 9/2001 | Hessee | |
| 6,301,655 B1 | 10/2001 | Manohar et al. | |
| 6,381,692 B1 | 4/2002 | Martin et al. | |
| 6,456,590 B1 | 9/2002 | Ren et al. | |
| 6,467,011 B2 * | 10/2002 | Scardamalia et al. | 710/305 |
| 6,502,180 B1 | 12/2002 | Martin et al. | |
| 6,594,234 B1 * | 7/2003 | Chard et al. | 370/236 |
| 6,625,159 B1 | 9/2003 | Singh et al. | |
| 6,657,962 B1 | 12/2003 | Barri et al. | |
| 6,678,277 B1 * | 1/2004 | Wils et al. | 370/412 |
| 6,735,679 B1 * | 5/2004 | Herbst et al. | 711/167 |
| 6,950,959 B2 | 9/2005 | Davies | |
| 7,050,324 B2 | 5/2006 | Cummings et al. | |
| 7,099,275 B2 | 8/2006 | Sarkinen et al. | |
| 7,120,117 B1 | 10/2006 | Liu et al. | |
| 7,263,066 B1 | 8/2007 | Yun et al. | |
| 7,394,808 B2 | 7/2008 | Figueira et al. | |
| 2002/0136229 A1 * | 9/2002 | Kramer et al. | 370/412 |
| 2003/0046496 A1 * | 3/2003 | Mitchem | 711/147 |
| 2003/0088694 A1 * | 5/2003 | Patek et al. | 709/238 |
| 2003/0135579 A1 | 7/2003 | Han et al. | |
| 2003/0146073 A1 | 8/2003 | Cummings et al. | |
| 2004/0151184 A1 | 8/2004 | Wang et al. | |
| 2004/0179476 A1 | 9/2004 | Kim et al. | |
| 2006/0182112 A1 | 8/2006 | Baffle et al. | |

FOREIGN PATENT DOCUMENTS

| | | |
|---|---|---|
| WO | WO03/043272 | 5/2003 |

OTHER PUBLICATIONS

[2] Cummings, et al. "An Asynchronous Pipelined Lattice Structure Filter", Department of Computer Science California Institute of Technology, Pasadena, California, pp. 1-8.

[3] Martin, et al. "The Design of an Asynchronous MIPS R3000 Microprocessor", Department of Computer Science California Institute of Technology, Pasadena, California, pp. 1-18.

[4] Lines, "Pipelined Asynchronous Circuits", Jun. 1995, revised Jun. 1998, pp. 1-37.

[5] Martin, "Erratum: Synthesis of Asynchronous VLSI Circuits", Mar. 22, 2000, Department of Computer Science California Institute of Technology, Pasadena, California, pp. 1-143.

[6] Venkat et al., "Timing Verification of Dynamic Circuits", May 1, 1995, IEEE 1995 Custom Integrated Circuits Conference.

[7] Wilson, "Fulcrum IC heats asynchronous design debate", Aug. 20, 2002, http://www.fulcrummicro.com/press/article_eeTimes_08-20-02.shtml.

[8] Martin, "Asynchronous Datapaths and the Design of an Asynchronous Adder", Department of Computer Science California Institute of Technology, Pasadena, California, pp. 1-24.

[9] Martin, "Self-Timed FIFO: An Exercise in Compiling Programs into VLSI Circuit", Computer Science Department California Institute of Technology, pp. 1-21.

[10] Clos, The Bell System Technical Journal, 1953, vol. 32, No. 2, pp. 406-424, Mar. 1953.

International Search Report dated Aug. 9, 2007, received in related PCT Application No. PCT/US06/00326 (3 pages).

Written Opinion of the International Searching Authority dated Aug. 9, 2007, received in related PCT Application No. PCT/US06/00326 (5 pages).

Minkenberg, C., "On Packet Switch Design, Eindhoven University of Technology", 2001, ISBN 90-386-0911-6.

Iyer, S. and McKeown, N., "Techniques for Fast Shared Memory Switches", Stanford HPNG Technical Report TR01-HPNG-081501 [online], 2001.

Aboul-Magd, RFC 4115, A Differentiated Service Two-Rate, Three-Color Marker with Efficient Handling of in-Profile Traffic, Jul. 2005, pp. 1-6.

Heinanen et al., RFC 2698, A Two Rate Three Color Marker, Sep. 1999, pp. 1-5.

Heinanen et al., RFC 2697, A Single Rate Three Color Marker, Sep. 1999, pp. 1-6.

Bergamasco, Cisco Systems, Inc., Updates on Backward Congestion Notification, IEEE 802 Plenary Meeting, San Francisco, USA, Jul. 20, 2005, pp. 1-18.

International Search Report and Written Opinion dated Jun. 27, 2008, from International Application No. PCT/US08/59668.

Examination Report dated Jan. 30, 2009 for related European Patent Application No. 06717512.5.

Office Action dated Jun. 11, 2009 from U.S. Appl. No. 11/737,511.

Notification Concerning Transmittal of International Preliminary Report on Patentability dated Sep. 20, 2007 from PCT Application No. PCT/US06/000326.

Office Action dated Mar. 3, 2010 from U.S. Appl. No. 11/737,511.

Notification Concerning Transmittal of International Preliminary Report on Patentability dated Oct. 29, 2009, PCT Application No. PCT/US2008/059668.

* cited by examiner

SHARED-MEMORY SWITCH FABRIC ARCHITECTURE

RELATED APPLICATION DATA

The present application claims priority under 35 U.S.C. 119(e) to U.S. Provisional Patent Application No. 60/643,794 filed on Jan. 12, 2005 (FULCP011P), the entire disclosure of which is incorporated herein by reference for all purposes.

BACKGROUND OF THE INVENTION

The present invention relates to a switch fabric architecture. More specifically, the present invention provides a shared memory switch architecture which may be employed to switch frames or packets of arbitrary lengths between any of its ports with sustained high speed throughputs.

Shared memory architectures are advantageous for high speed switches with many ports because they make more efficient use of memory. That is, if the memory resides in the ports themselves, the memory in idle ports sits unused while the memory in active ports may be overworked, particularly where the transmission protocol allows very large packets. In addition, where the transmission protocol for which the switch is designed has multicast requirements (e.g., Ethernet), shared memory only requires that that a multicast packet be written to memory once. The multiple ports for which the multicast packet is intended then read the same memory location, an operation which requires no more overhead than if the ports were reading different memory locations. Because of this suitability, shared memory architectures are particularly popular for implementing Ethernet switches.

Conventional approaches to designing such architectures employ synchronous circuits and design flows which face significant obstacles, particularly as both the number of ports and the required speed of each port continue to increase. It is therefore desirable to provide alternatives to such approaches which can keep pace with the increasing demands for performance.

SUMMARY OF THE INVENTION

According to the present invention, a shared memory architecture is provided which enables a high port count despite a modest maximum memory speed. According to a specific embodiment, a shared memory is provided having a plurality of receive ports and a plurality of transmit ports characterized by a first data rate. A memory includes a plurality of memory banks organized in rows and columns. Operation of the memory array is characterized by a second data rate. Non-blocking receive crossbar circuitry is operable to connect any of the receive ports with any of the memory banks. Non-blocking transmit crossbar circuitry is operable to connect any of the memory banks with any of the transmit ports. Buffering is operable to decouple operation of the receive and transmit ports at the first data rate from operation of the memory array at the second data rate. Scheduling circuitry is operable to control interaction of the ports, crossbar circuitry, and memory array to effect storage and retrieval of the data segments in the shared memory. The scheduling circuitry is further operable to facilitate striping of each data segment of a frame across the memory banks in one of the rows, and to facilitate striping of successive data segments of the frame across successive rows in the array.

A further understanding of the nature and advantages of the present invention may be realized by reference to the remaining portions of the specification and the drawings.

DETAILED DESCRIPTION OF SPECIFIC EMBODIMENTS

Figure 1:
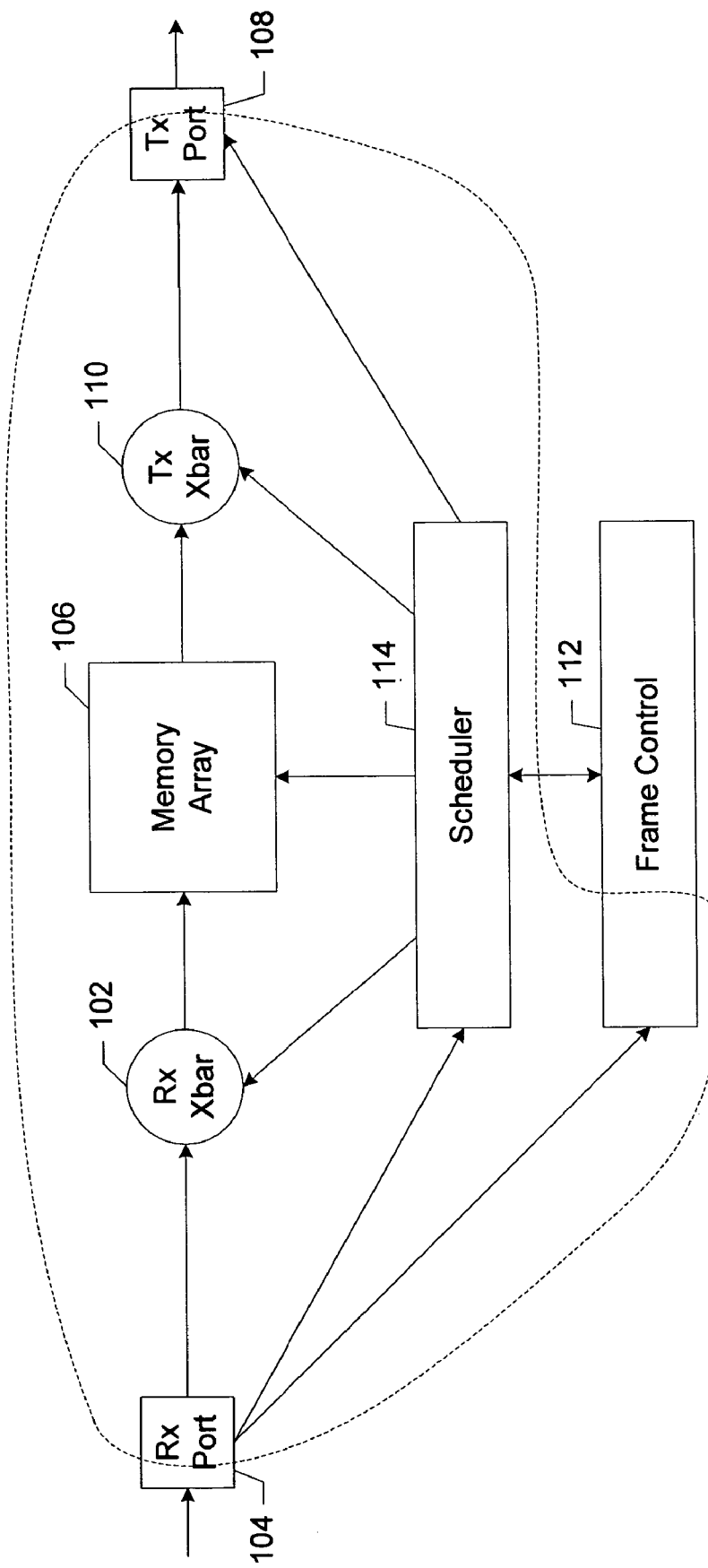
FIG. 1 is a block diagram illustrating a multi-ported switch according to a specific embodiment of the invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Various embodiments will be described in which some portions of the architecture are implemented according to an asynchronous, delay-insensitive or quasi-delay-insensitive design flow. Asynchronous VLSI is an active area of research and development in digital circuit design. It refers to all forms of digital circuit design in which there is no global clock synchronization signal. Delay-insensitive asynchronous designs, by their very nature are insensitive to the signal propagation delays which have become the single greatest obstacle to the advancement of traditional design paradigms. That is, delay-insensitive circuit design maintains the property that any transition in the digital circuit could have an unbounded delay and the circuit will still behave correctly. The circuits enforce sequencing but not absolute timing. This design style avoids design and verification difficulties that arise from timing assumptions, glitches, or race conditions.

For background information regarding delay-insensitive asynchronous digital design, please refer to the following papers: A. J. Martin, "Compiling Communicating Processes into Delay-Insensitive Circuits," *Distributed Computing*, Vol. 1, No. 4, pp. 226-234, 1986; U. V. Cummings, A. M. Lines, A. J. Martin, "An Asynchronous Pipelined Lattice Structure Filter." *Advanced Research in Asynchronous Circuits and Systems*, IEEE Computer Society Press, 1994; A. J. Martin, A. M. Lines, et al, "The Design of an Asynchronous MIPS R3000 Microprocessor." *Proceedings of the* 17*th Conference on Advanced Research in* VLSI, IEEE Computer Society Press, 1997; and A. M. Lines, "Pipelined Asynchronous Circuits." *Caltech Computer Science Technical Report* CS-TR-95-21, Caltech, 1995; the entire disclosure of each of which is incorporated herein by reference for all purposes.

See also U.S. Pat. No. 5,752,070 for "Asynchronous Processors" issued May 12, 1998, and U.S. Pat. No. 6,038,656 for "Pipelined Completion for Asynchronous Communication" issued on Mar. 14, 2000, the entire disclosure of each of which is incorporated herein by reference for all purposes.

At the outset, it should be noted that many of the techniques and circuits described in the present application are described and implemented as delay-insensitive asynchronous VLSI. However it will be understood that many of the principles and techniques of the invention may be used in other contexts such as, for example, non-delay insensitive asynchronous VLSI and synchronous VLSI.

It should also be understood that the various embodiments of the invention may be implemented in a wide variety of ways without departing from the scope of the invention. That is, the asynchronous processes and circuits described herein may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for designing and manufacturing the processes and circuits described herein are within the scope of the invention.

In addition, specific ones of these embodiments will be described with reference to the switching of 10-Gigabit Ethernet data. However, it should be noted at the outset that the basic principles of the present invention may be applied in a variety of contexts and that, therefore, the invention should not be limited by reference to such embodiments.

Referring now to the block diagram of FIG. 1, portions of a multi-ported switch are shown. A receive (Rx) crossbar 102 switches incoming data from any of a plurality of Rx ports 104 to any of a plurality of banks of memory in memory array 106. The data in memory array 106 are switched to any of a plurality of transmit (Tx) ports 108 via Tx crossbar 110. According to a specific embodiment, each Rx port 104 and a corresponding one of Tx ports 108 correspond to an Ethernet port. It will be understood that only single Rx and Tx ports are shown for the sake of simplicity. In addition, embodiments of the invention are discussed below with reference to specific numbers of ports, e.g., 20, 24, 32, etc. It will be understood, however, that these numbers are merely exemplary and should not be used to limit the scope of the invention.

When data are received by an Rx port 104, a portion of the data, e.g., a frame or packet header, is copied and sent to frame control block 112, and all of the data, i.e., including the copied portion and the payload, are sent to memory array 106 for storage. Frame control 112 is a pipelined unit which provides frame control information to scheduler 114 to facilitate storage of the payload in memory. Frame control 112 makes decisions on a per frame basis including, for example, whether to modify the frame, or whether to discard it. Frame control 112 then sends its decision to scheduler 114 which is responsible for generating the controls which move and store the data.

According to a specific embodiment, crossbars 102 and 110, memory array 106, scheduler 114, a portion of each of ports 104 and 108, and a portion of frame control 112 (all enclosed within the dashed line) are implemented according to the asynchronous design style mentioned above. The remaining portions of the ports and the frame control are implemented using any of a variety of conventional synchronous design techniques. According to an Ethernet implementation, the synchronous portions of the ports present the expected external interfaces expected by the system(s) to which the switch is connected. The synchronous portion of the frame control is implemented according to a synchronous design style, e.g., Verilog, at least in part because it comprises complex but relatively straightforward logic for which such design styles are well suited. The details and advantages of this approach will become more apparent with reference to the discussion below.

According to specific implementations, the interfaces between synchronous and asynchronous portions of the architecture may be implemented according to the techniques described in U.S. Patent Publication No. 20030159078 for *Techniques For Facilitating Conversion Between Asynchronous and Synchronous Domains* published on Aug. 21, 2003 Ser. No.10/212574, the entire disclosure of which is incorporated herein by reference for all purposes.

As mentioned above, the switch architecture of the present invention is operable to switch frames or packets of arbitrary length between its ports. As will be described, memory in the array is allocated in fixed-size blocks referred to herein as "segments." However, according to specific embodiments, data are moved through the switch fabric in smaller fixed-size blocks referred to herein as "subsegments." Some exemplary numbers which assume the switch architecture is embodied as an Ethernet switch will be instructive. Notwithstanding the following discussion, implementations in which the terms segment and sub-segment refer to the same size unit of data are contemplated.

It is a significant design challenge to accommodate frames which have a wide range of length, e.g., from a minimum length of 64 bytes to a maximum length of about 10 kilobytes. As will be understood by those of skill in the art, the allowance of such extremely long frames is problematic for cut-through and multicast applications. According to a specific embodiment of the invention, memory is allocated in 256 byte segments. This length keeps segment processing overhead manageable, e.g., keeps the number of memory pointers within reason. However, data are moved through the switch fabric using subsegments of 64 bytes to reduce latency. It should be noted that the terms "frame" and "packet" may be used interchangeably and refer to the variable length native data unit in the protocol associated with the system in which the various embodiments of the invention are implemented.

Figure 2:
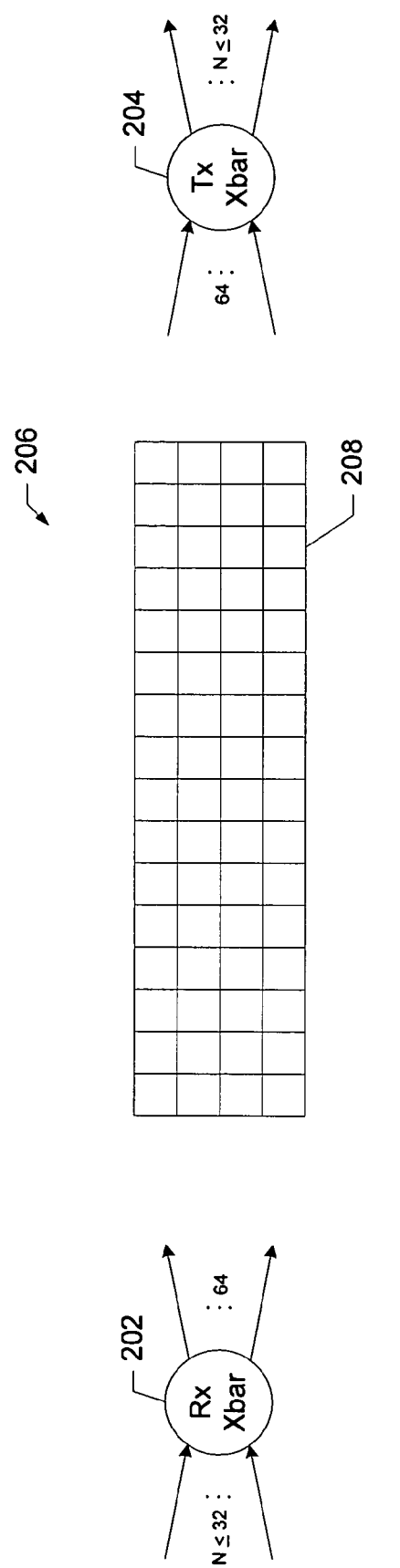
FIG. 2 is a block diagram illustrating portions of a datapath for use with specific embodiments of the invention.

An exemplary configuration of a data path suitable for implementing various embodiments of the invention will now be described with reference to FIG. 2. Rx crossbar 202 is shown as an N channel×64 channel crossbar, and Tx crossbar 204 is shown as a 64×N crossbar. According to various embodiments, N may take on any of a wide range of values. In the embodiments described below, the specific architecture described is physically configured to handle up to 32 ports. However, much of the performance discussion assumes that the architecture is provisioned for some number less than 32 ports, e.g., 20 or 24. It should be understood that N may also take on values greater than 32, although ultimately, N is limited by and scales with the speed of the memory for which the design is to be fully provisioned. It will also be understood that each channel comprises a multi-bit data path, e.g., a 32-bit data path.

Memory array 206 may be thought of as an array of 4,096 segments of 256 bytes each, each segment corresponding to four sub-segments of 64 bytes each. The array is divided into 64 16 kB banks 208 of SRAM, one bank for each of the 64 Rx and Tx crossbar channels, i.e., the write channel for each bank being connected to one of the Rx crossbar output channels, and the read channel being connected to one of the Tx crossbar input channels. Although the exemplary array of FIG. 2 is shown having 16 columns and 4 rows, it will be understood that the numbers of columns and rows may vary significantly for the myriad applications to which the invention is suited.

As the 64-byte sub-segments of a frame come into the memory, each 4-byte word of the sub-segment is placed in incrementing SRAM locations, "striping" through the 64 SRAM banks in a linked list of segments corresponding to the frame. According to a specific embodiment, each subsegment is striped through the banks in a particular row, with successive sub-segments in a segment being striped in successive rows.

According to some embodiments, successive frames starting in a given bank are written beginning at the same subsegment. However, this results in the "lower" portions of the memory banks being worked very hard while the "upper" portions are frequently idle. Therefore, according to some embodiments, different subsegment starting points within the bank are selected for successive frames starting in a particular bank. This selection may be done pseudo-randomly or deterministically. According to one embodiment, the selection of the starting point for a new frame is responsive to detection of the condition where multiple ports are trying to access a particular bank of memory at the same time. Such an approach may be used to reduce the likelihood that frames will be dropped for embodiments in which the SRAM array operates more slowly for a given number of ports than the maximum packet rate. Alternatively, such an approach may be used to provide additional margin.

In addition to rotating banks within a sub-segment as described above, embodiments of the invention are contemplated in which the sub-segments within a segment are rotated. Selection may again be done pseudo-randomly or deterministically. Deterministic selection might, for example, employ a linear order. Alternatively, a "score-boarding" approach might be employed in which selection is based on a least-recently-allocated approach.

Because the data path elements of the switch architecture of the present invention are implemented asynchronously, a significant advantage is realized with regard to how fast the SRAM memory array must run to keep up with the port data rates. Where the ports correspond to Ethernet ports, each port must be able to handle 15 million frames ($\geq$ 64 bytes) per second with fixed-size 20 byte gaps between successive frames (i.e., 10 Gigabit data rate). In order to provide a worst case, fully provisioned switch fabric for 24 10 Gb/s ports, a synchronous memory must operate at 469 MHz (i.e., the maximum data rate or burst speed) for both reading and writing (240 Gb/s/512 b stripe=469 MHz). However, because the asynchronous SRAM can stall during the 20-byte gaps between frames, only the crossbars need to be running fast enough to keep up with the burst speed, while the memory can be running at the sustained speed, i.e., the frame rate times the number of ports (which is roughly equivalent to 360 MHz for a dual-ported SRAM, or 720 MHz for a single-ported SRAM), without dropping frames.

In such an implementation, the maximum data rate is handled by the manner in which the data are striped through the SRAM. That is, if 24 ports are assumed, a single SRAM row is going to receive, at most, twenty-four 64 byte subsegments before one of two things happens. If the frame being received on a given port is complete, the SRAM bank will go idle. If, on the other hand, any of the 24 frames has additional subsegments, the data will shift to the next row of SRAM banks, (which has been sitting idle and ready to go) and continue striping through the SRAM. Thus, because of the inter-frame gaps, the asynchronous SRAM never has to operate faster than the maximum frame rate (as opposed to the maximum data rate) to be fully provisioned.

The asynchronous data path takes advantage of this slack in the system to smooth out the burstiness of the incoming data, making a 24-port switch efficient. By contrast, a comparable dual-ported synchronous memory operating at 360 MHz could only support 18 ports. In addition and according to a specific embodiment, embodiments of the present invention may be implemented using a single-ported asynchronous SRAM architecture (which alternates reads and writes) described in U.S. patent application Ser. No. 10/890,816 for ASYNCHRONOUS STATIC RANDOM ACCESS MEMORY filed Jul. 13, 2004 the entire disclosure of which is incorporated herein by reference for all purposes. That is, such a memory can operate at the equivalent 720 MHz rate required by 24 ports, and yet have the relatively small footprint of a single-ported architecture. A comparable synchronous system would have to resort to the use of a dual-ported architecture (which consumes considerably more area), because single-ported designs for a 24-port switch would have to operate at 938 MHz, considered too high of a frequency for standard synchronous memory implementations in 0.13 um Technology.

Figure 3:
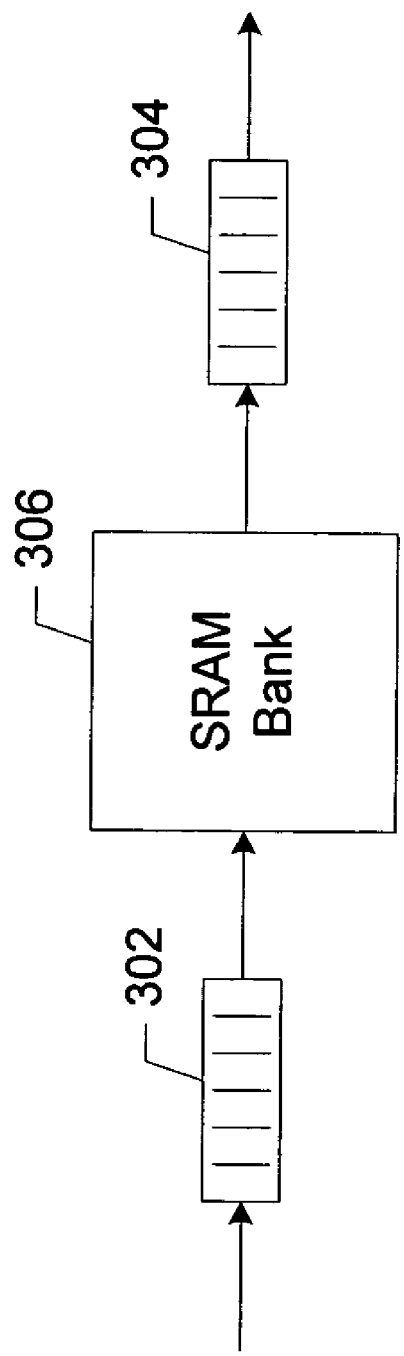
FIG. 3 is a block diagram illustrating portions of a datapath for use with specific embodiments of the invention.

Referring now to FIG. 3, to account for the different speeds of operation, burst FIFOs 302 and 304 are provided between each memory bank 306 and the corresponding Rx crossbar output channel and Tx crossbar input channel. FIFOs 302 and 304 are sufficiently large to handle the worst case bursts from the crossbar channels. That is, the Rx and Tx crossbars are provisioned to receive and transmit data from and to a large number of ports (e.g., 20 or more). This imposes an operation speed requirement on the crossbars which is difficult to achieve for SRAM bank 306. FIFOs 302 and 304 allow for SRAM bank 306 to have a more modest operation speed while also allowing the Rx and Tx crossbars to receive and transmit data in bursts at their respective maximum operation speeds.

Figure 4:
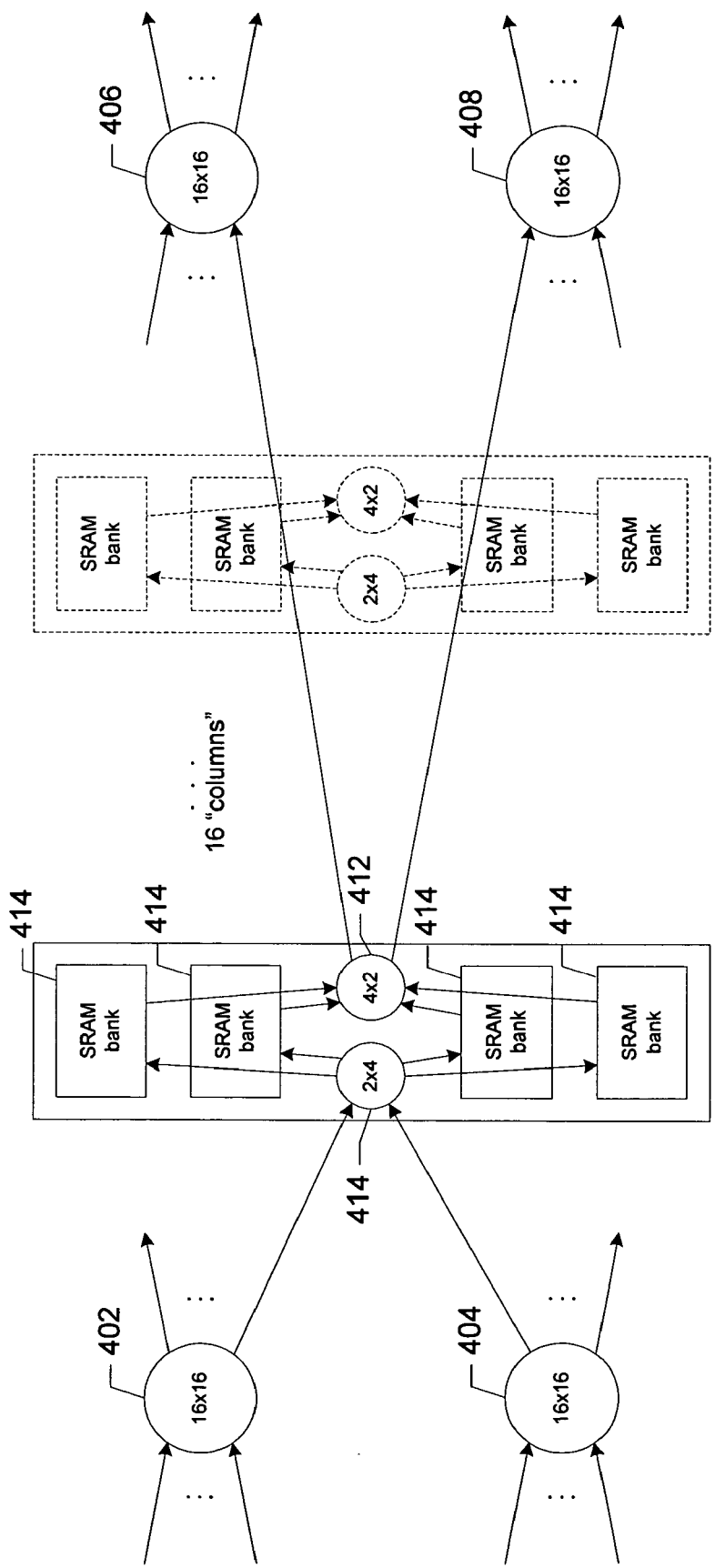
FIG. 4 is a more detailed block diagram illustrating portions of a datapath for use with specific embodiments of the invention.

As shown in FIG. 1, the Rx and Tx crossbars may each be implemented as a single 32×64 or 64×32 crossbar, respectively. However, implementing such large crossbars can be electrically inefficient. Therefore, according to a specific embodiment of the invention illustrated in FIG. 4, the 32 ports are connected to 64 banks of memory using two 16×16 crossbars (402-408) for both the receive and transmit sides of the ports in combination with 16 2×4 crossbars 410 and 16 4×2 crossbars 412 to get in and out of the individual memory banks 414. That is, for example, each 32-bit output channel of crossbar 402 is coupled to one of the two input channels of one of crossbars 410. Each of the four output channels of each crossbar 410 is coupled to the write channel of one of the four associated memory banks 414. The read channel of each of memory banks 414 is coupled to one of the four input channels of the associated one of crossbars 412. Each of the output channels of each crossbar 412 is then coupled to one of the input channels of one of the crossbars 406 or 408. This distributed, non-blocking crossbar system connects each of the ports (up to 32) to the read and write channels of each of the 64 banks of SRAM.

According to a specific embodiment, techniques derived from the well known Clos Architecture are applied the problem of port scalability. A Clos architecture has two requirements, i.e., 1) a CCB (constant cross-sectional bandwidth) (2N–1 links through a mid tier of switches); and 2) some mechanism for scheduling onto the available links. According to an embodiment described herein, we use multiple asynchronous crossbars to create a CCB multi-stage switch. In addition, striping techniques (described below) create a non-blocking means of scheduling the segments onto the memory elements. This enables scaling up the port count to the fundamental limit of the memory speed without introducing any blocking. According to some embodiments, we can scale even further when a higher statistical performance is enabled when the memory worst case event rate is addressed with the random striping. For additional information relating to non-blocking architectures, please refer to *A study of non-blocking switching networks* by Charles Clos, The Bell System Technical Journal, 1953, vol. 32, no. 2, pages 406-424, the entire disclosure of which is incorporated herein in its entirety for all purposes.

Regardless of the size and or combination of crossbars, each individual crossbar may be implemented in a variety of ways. According to one set of embodiments, the crossbars may be implemented as described in U.S. Patent Publication No. 20030146073 A1 for *Asynchronous Crossbar With Deterministic or Arbitrated Control* published on Aug. 7, 2003 (Ser. No. 10/136025), the entire disclosure of which is incorporated herein by reference for all purposes.

Figure 5A:
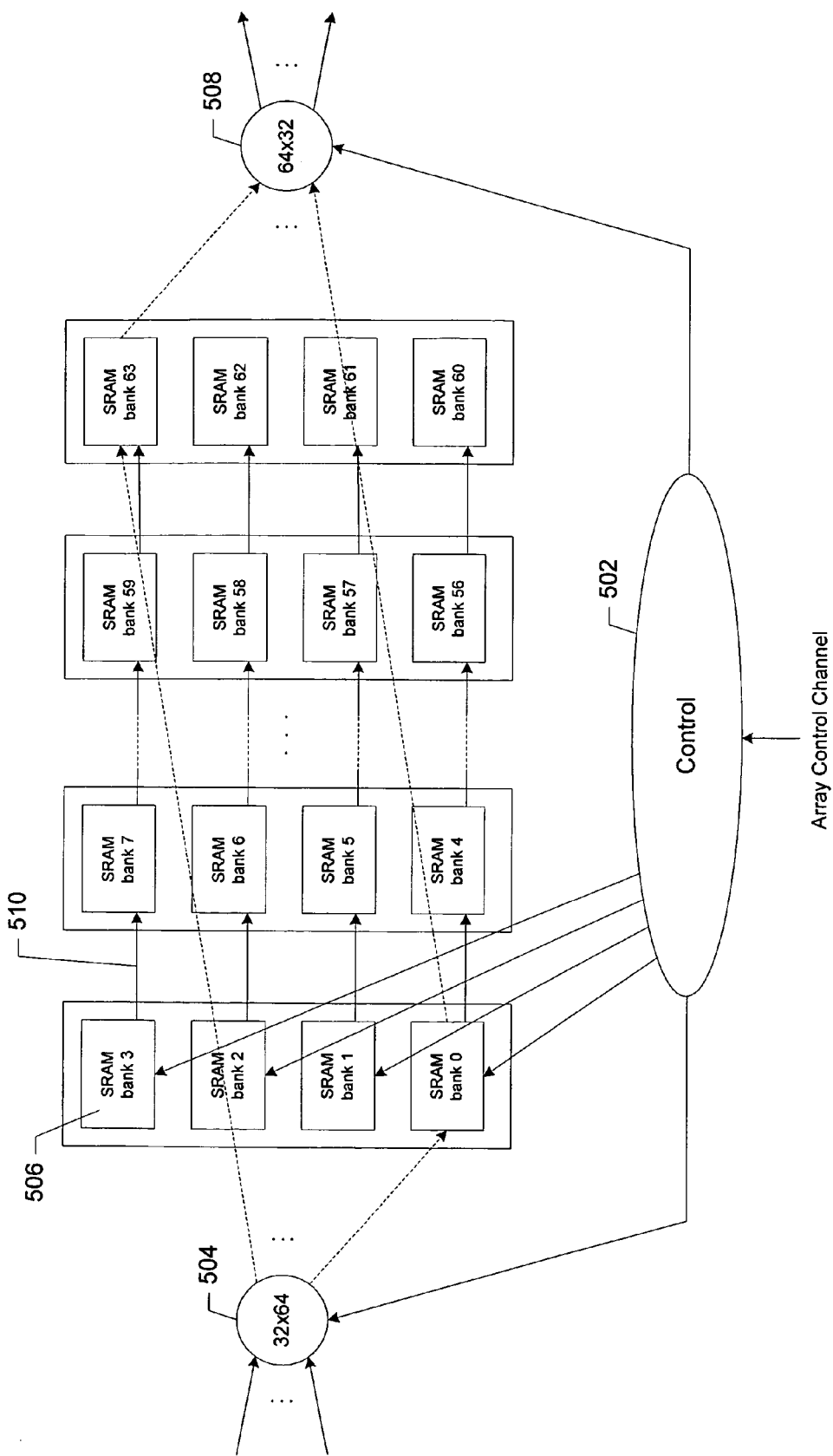
FIGS. 5A and 5B are block diagrams illustrating distribution of control in a datapath for use with specific embodiments of the invention.
Figure 5B:
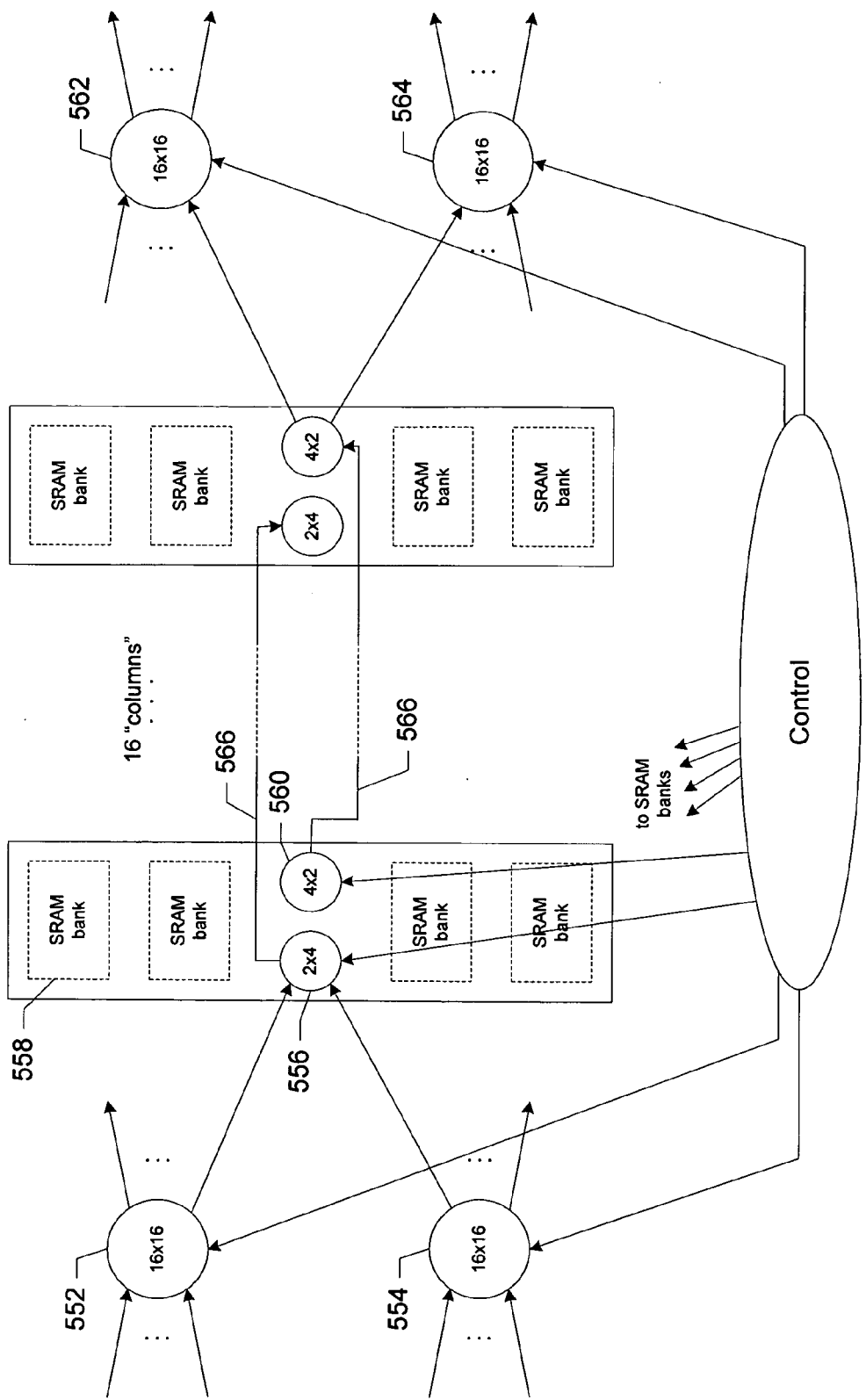

Distribution of control signals to the datapath described above will now be discussed with reference to FIGS. 5A, 5B and 6. In FIG. 5A, the Rx and Tx crossbars are once again represented as single 32×64 and 64×32 crossbars for simplicity. Both FIGS. 5A and 5B show the control as a single block also for simplicity. Additional details regarding how the control signals are generated is discussed below with reference to subsequent figures.

According to a specific implementation, control 502 receives a single control stream (represented as the "array control channel" input to control 502) from a scheduler (not shown) and generates control channels for Rx crossbar 504, SRAM banks 506, and Tx crossbar 508. The SRAM control information includes an address and a read/write bit. The crossbar control information for each crossbar identifies the crossbar input and output channels (i.e., the from/to crossbar port combination) and the length of the frame or packet. The array control channel includes a read bit, a read address, a read port, a read length, a write bit, a write address, a write port, and a write length. According to a specific embodiment, the read and write lengths represent how many unused words in the final 64 byte subsegment of a frame. This enables reading and writing to stop when a frame ends rather than taking up memory locations with dummy information.

The array control channel, therefore, simultaneously provides information for writing a 64 byte subsegment to memory and reading a 64 byte subsegment from memory, wherein the two subsegments may or may not be related. With a maximum packet rate of 300 MHz (assuming 20 ports) and a 64 byte subsegment size, the read and write channels may be fully provisioned if each operates at about 600 MHz. For a fully-provisioned 20 port switch, this translates to an equivalent data rate of operation for control 502 of 1.2 GHz. However, by using two independent control streams for RX and TX, the actual data rate is just 600 MHz. A lower max pipeline speed, or a higher port count could be achieved by breaking up the control stream into 4 independent streams which follow each of the four crossbars (note: this assumes the 4 crossbar example).

Control 502 translates one command on the array control channel to everything that is needed to write one 64-byte subsegment to the SRAM array and read one 64-byte subsegment from the array. According to a specific embodiment, the manner in which the control information is transmitted to the crossbars and the SRAM array makes it possible to begin executing the next command after only the first word(s) of the previous command has been written/read. For example, on the receive side, word 0 associated with one command is transmitted to memory on the cycle following word 0 of the previous command (or simultaneously with word 1 of the previous command). That is, successive commands are executed out-of-sync by one cycle.

This "overlapping" execution of commands is facilitated by the manner in which the control information is introduced into the SRAM array. That is, the control information is provided to the first "column" of SRAM banks 506 and then "rippled" across the array to the corresponding banks in the other columns as indicated by arrows 510. Because of the manner in which frames are "striped" across the SRAM banks, the same start address is used in each successive bank to store the subsegments of a particular frame. Therefore, the address information need only be sent from control 502 one time, and then shared among the columns. As the information is rippling across the array, the length is decremented so that the write or read stops when there are no more data to be stored or read, i.e., the address information ripples until the length of the subsegment (16 words or less) is reached and then "dies out." This enables efficient variable length transfer without the use of a tail bit in the datapath.

The Rx and Tx crossbars are pipelined and fully parallel so that they can start transmitting a subsegment (which can take up to 16 cycles) every cycle.

Referring now to FIG. 5B, the transmission of the control information to the datapath will be described for the distributed crossbar architecture discussed above with reference to FIG. 4. Each of the output channels of two 16×16 Rx crossbars 552 and 554 is connected to an input channel of a 2×4 crossbar 556 in each of 16 columns of SRAM banks 558. Each of the four output channels of each crossbar 556 is connected to one of the four SRAM banks 558. In this way, up to 32 Rx input channels may be connected to each of the 64 banks of SRAM. Similarly, each of the SRAM banks in a column is connected to the input channels of the column's 4×2 crossbar 560. The two output channels of each crossbar 560 are connected to one input channel of Tx crossbars 562 and 564, respectively. In this way, each of the 64 SRAM banks may be connected to up to 32 Tx output channels.

Control channels are sent by control 502 to the crossbars in the datapath. One control channel is sent for each of crossbars 552, 554, 562 and 564. One control channel is also sent to crossbars 556 and 560 in the first "column" of SRAM banks. This control information is then rippled across the other 16 "columns" (as indicated by arrows 566) such that successive words of the frame are stored in, i.e., striped across, successive SRAM banks as described above for the SRAM control information.

The control information for each 16×16 crossbar includes 8 bits; 4 bits identifying the input or output channel (depending on whether it is Rx or Tx) and 4 bits indicating the "length," i.e., the number of words in the subsegment. The control information for the 2×4 and 4×2 crossbars includes 7 bits; 3 bits to encode the input/output channel combination, and 4 bits for the subsegment length. The control information to each of the four SRAM banks 558 in the first "column" of the SRAM array includes 17 bits, a 12-bit address (i.e., one of 4096 possible 256 byte segments in each bank), one read/write bit, and 4 bits for subsegment length. As described above, this information is then rippled across the array to the corresponding banks in each successive columns (i.e., until the information "dies out.").

Figure 6:
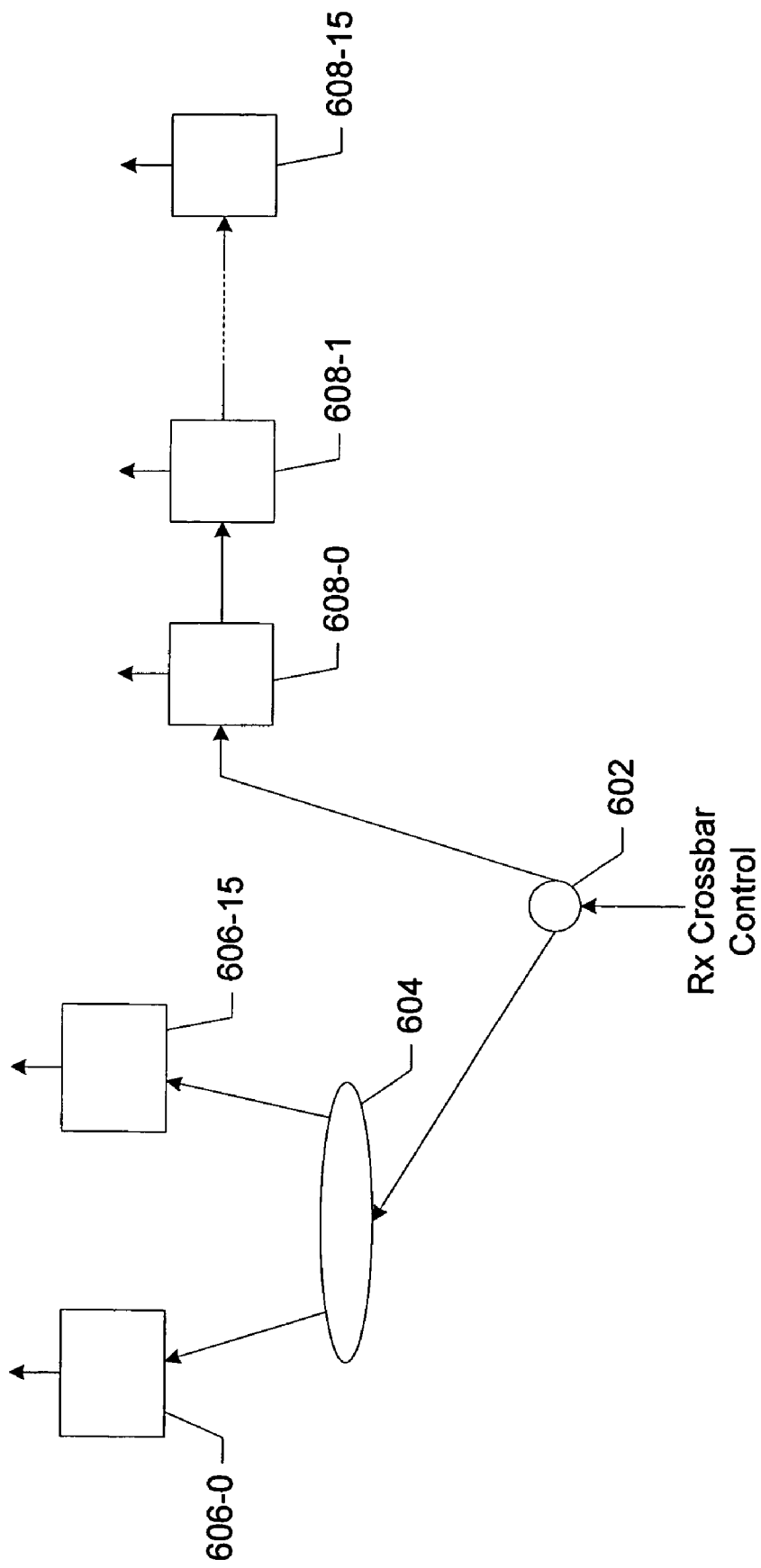
FIG. 6 is a more detailed block diagram illustrating distribution of control in a datapath for use with specific embodiments of the invention.

FIG. 6 illustrates how a single stream of 4 bits of input channel information and 4 bits of length information may be distributed throughout one of the 16×16 Rx crossbars sufficiently quickly to keep up with the required data rate. It should be noted that a similar but "mirror image" control path is implemented for the 16×16 Tx crossbars. Initially the 8 bits of information is copied (602) with one stream being used for serial "outer" control information and the other for parallel "inner" control information. That is, as will be described, the control for the outer crossbar channels (i.e., input side for Rx and output side for Tx) is serialized, while the control for the inner crossbar channels (i.e., input side for the Tx and output side for the Rx) is parallelized.

The outer control information is split 16 ways (604), i.e., one for each input port, according to the 4 bits of input channel information. This serializes the control to the input channels of the Rx crossbars while also allowing the control information for successive subsegments to be distributed on successive cycles even though subsegments may take up to 16 cycles to transmit. The control is repeated (606) to the corresponding input channel of the crossbar until the length of the subsegment is reached (as determined by decrementing the length count).

The inner control information is rippled through the output channel control of the Rx crossbar (608-0 through 608-15), successively connecting the designated input channel of the Rx crossbar to as many of the 16 output channels as are required to transmit the subsegment to the successive banks of the SRAM array (as indicated by the 4-bit length). Thus, the control of the Rx crossbar output channels is parallelized. As mentioned above, the control for the 16×16 Tx crossbars is nearly identical except that it is the control for the input channels of the Tx crossbars which is parallelized and the control for output channels which is serialized.

Figure 7:
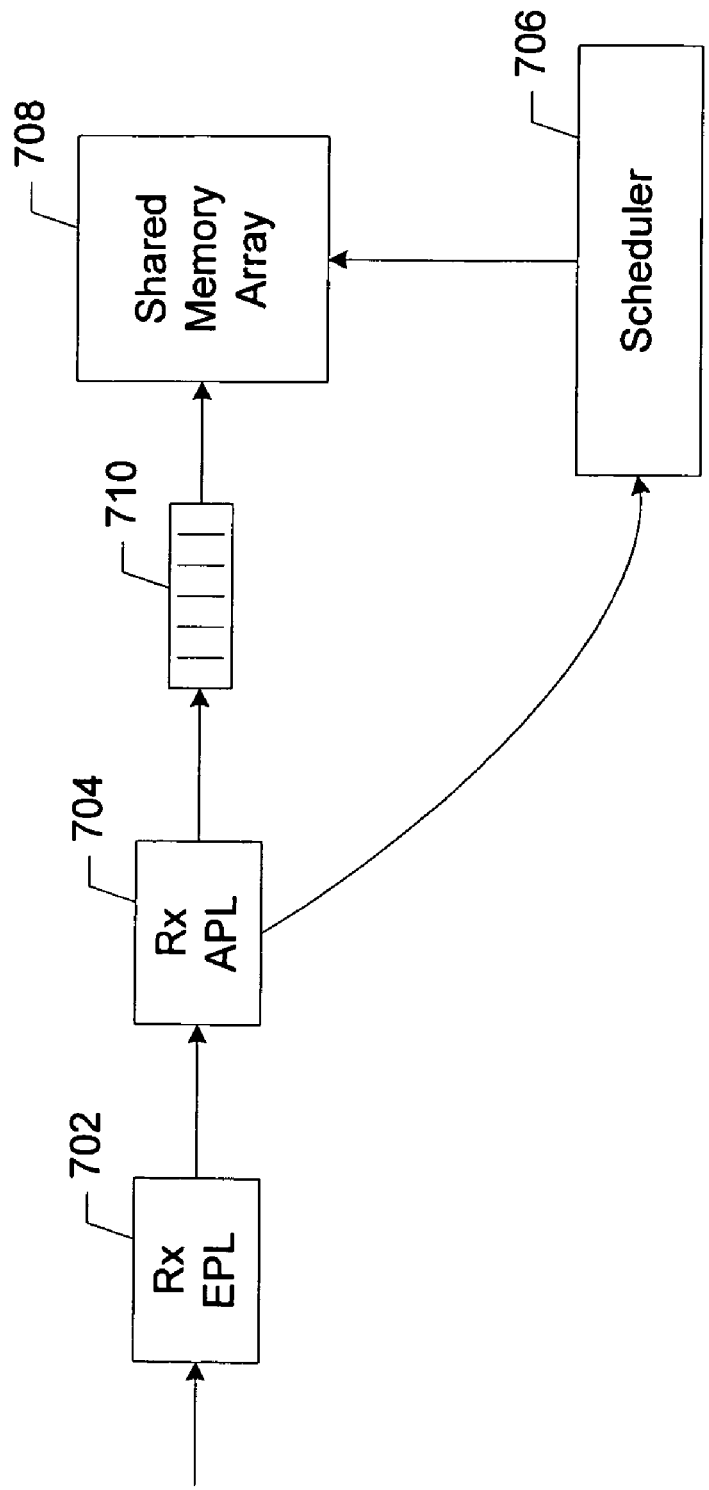
FIG. 7 is a block diagram illustrating the receive portion of a port for a multi-ported switch according to a specific embodiment of the invention.
Figure 8:
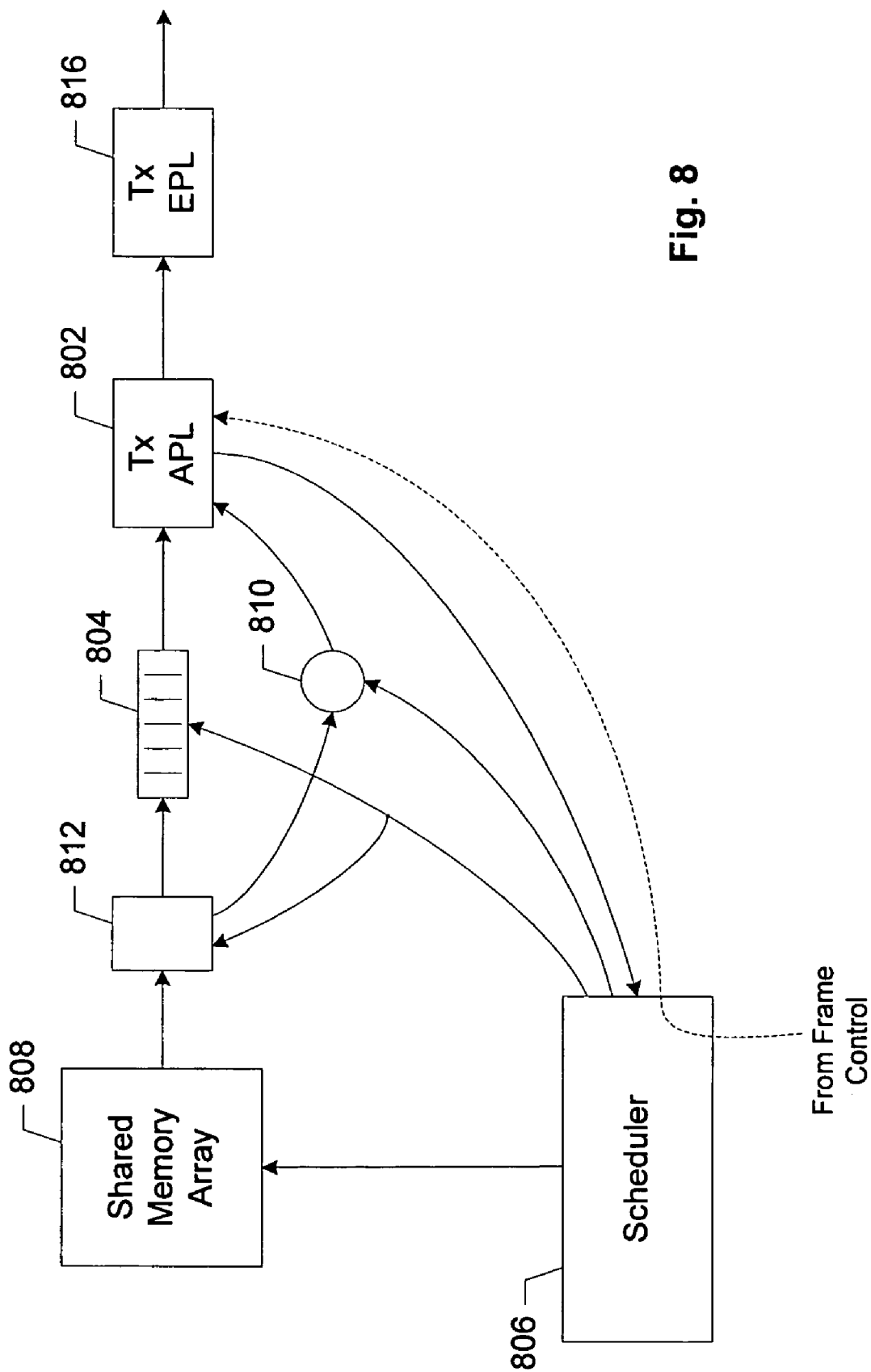
FIG. 8 is a block diagram illustrating the transmit portion of a port for a multi-ported switch according to a specific embodiment of the invention.

A more detailed description of the nature of some exemplary Rx and Tx ports for use with the present invention (e.g., ports 104 and 108 of FIG. 1) will now be provided with reference to FIGS. 7 and 8. As with other portions of the description, an Ethernet implementation is assumed for exemplary purposes, but should not be used to limit the scope of the invention.

FIG. 7 shows a simplified block diagram of the Rx portion of a port including Rx Ethernet port logic (EPL) 702, a synchronous block which presents the expected interface characteristics (as defined in the Ethernet specification) to the outside of the switch. Rx asynchronous port logic (APL) 704 is, as the name implies, an asynchronous block which provides the appropriate portion of the incoming data from Rx EPL 702 to scheduler 706 (operation of which is described below) and the frame control (not shown). For every subsegment to be stored in the SRAM array 708, Rx APL 704 provides 8 bits of subsegment data (RxSS) to scheduler 706, 6 bits encoding the length of the subsegment (i.e., 1-64 bytes), an end-of-frame (EOF) bit, and an error bit. The subsegment data are placed in FIFO 710 and are then stored in array 708 in accordance with the control information from scheduler 706. Rx APL 704 also provides the first 16 bytes of every frame and the length and error flags (from the end of the frame) to the frame control (not shown) for use as will be described below.

FIFO 710 is a "jitter" FIFO which has a couple of benefits. Because the crossbar(s) of the present invention are non-blocking, data do not back up into the switch port logic (e.g., Rx EPL 702). However, there may be a small wait time until arbitration permission is received. FIFO 710 provides buffering to absorb this latency. In addition, FIFO 710 allows data to be streamed into the shared memory array at the speed of the crossbar(s) rather than at the speed of the port logic, i.e., it decouples the operating speeds of the port logic and the crossbars. According to a specific embodiment, FIFO 710 (which may be integrated with Rx APL 704) can store an entire segment, thereby enabling cut-through operation of the shared memory.

It should again be noted that the various specific embodiments of the invention may be generalized beyond the specific implementation details described herein. For example, in the implementation discussed above with reference to FIG. 7, it should be understood that the asynchronous nature of Rx APL 704 is not particularly significant. That is, Rx APL 704 happens to be asynchronous in this particular embodiment. Rather, it should be conceptualized as the boundary of a generic switch element designed according to the present invention which includes features such as variable packet storage, cut-through forwarding, fully provisioned multicast, and egress tagging. By contrast, Rx EPL 702 merely gives an application specific context (i.e., Ethernet), a "protocol personality" according to which such a switch may be implemented. Other interconnect technologies, e.g., Serial Rapid I/O, Advanced Switching, Infiniband, etc., would provide a different context which would result in different boundary element characteristics. Multiple personalities of a particular interconnect technology (e.g., multiple Ethernet personalities), as well as higher level processing (e.g., IP processing) may also be supported.

FIG. 8 shows a simplified block diagram of the Tx portion of a port. Tx APL 802 tracks the state of FIFO 804 and sends a "ready" signal to scheduler 806 when there is room in FIFO 804 for another subsegment from SRAM array 808. Scheduler 806 provides 8 bits of subsegment data (TxSS) to counter 810, 6 bits for the length of the packet, an EOF bit, and an error bit. Tx APL 802 does not start draining subsegments from FIFO 804 until there are sufficient subsegments for the current frame in the FIFO to ensure that it doesn't "run dry." This is ensured using counter 810 which asserts a "go" signal to Tx APL 802 only after one of two conditions is satisfied; either when counter 810 completes its count or when the end-of-frame is detected.

According to a specific embodiment, counter 810 is reset for each frame using a programmable value received from scheduler 806. It should be noted that a register in the scheduler was chosen for architectural convenience. It will be understood that this value may be stored in a register anywhere in the system. According to various specific implementations, the counter value may take any one of a plurality of values depending on current or expected system conditions.

According to a specific embodiment, there are three different programmable values used which correspond to three different conditions. First, if a frame is only 64 bytes, the counter value is zero, i.e., the "go" signal is asserted and Tx APL 802 is immediately allowed to start draining FIFO 804 (i.e., the frame is less than or equal to one subsegment and there is no jitter by definition). Second, if the system is operating in "store-and-forward" mode (i.e., transmission of a frame begins only after the entire frame has been received), the counter value is set such that the "go" signal is asserted when some number of subsegments (e.g., four) are in the FIFO (e.g., the writing of the frame is one segment (256 bytes) ahead of the reading). Finally, if the system is operating in "cut through" mode (i.e., transmission of a frame is allowed to begin before the entire frame has been received), the counter value is set such to twice the value for the store-and-forward case as this case experiences the most jitter. Thus, because the scheduler has the information to determine whether a whole segment is present when it starts scheduling, it can optimize which watermark to use. It will be understood that these values are merely exemplary, and any suitable counter value(s) may be employed to tune system operation.

Counter 810 also receives notification of the end-of-frame from EOF detector 812 which receives a copy of the subsegment data and asserts the EOF signal to counter 810 when the end-of-frame is detected. In response to the EOF signal, counter 810 asserts the "go" signal to Tx APL 802 (unless it has already been asserted based on the counter value).

According to a specific implementation, the frame control (not shown) also sends frame level information (i.e., egress tag packet processing) to Tx APL 802 (or EPL 816) for modifying the frame on its way out of the switch. This frame level information (which may pass through scheduler 806) is sideband information required to transmit a frame and typically commands the Tx APL or EPL to modify the frame header in some way. For example, in an Ethernet implementation, this frame level information could include VLAN tag modification information.

If the RxSS error bit indicates an error, if the error can catch up to the frame before it begins transmission, i.e., the switch "knows" about the error before transmission begins, then the frame is silently discarded. This will always happen in store-and-forward mode. However, in cut-through mode, this will only happen under some circumstances, e.g., switch congestion or short frames. If the TxSS error bit indicates an error, a corrupted CRC is inserted in the frame (e.g., in the EPL).

As used herein, "jitter" refers to any delay between successive operations which is introduced by any of the arbitration, serialization, and banking in the switch element of the present invention. There are two main sources of "jitter" which are smoothed out by various features of the architecture. A first source of jitter is due to the fact that the scheduler queries each port in sequence, but the interval between consecutive queries of the same port can vary dramatically, e.g., 0-35 ns. A second and larger source of jitter is due to the fact that there is a fair amount of control channel buffering in the system to smooth out the "burstiness" of the datapath performance. That is, although this buffering has the positive effect of smoothing out the system performance relative to such bursts, it is possible that this slack, when full, may introduce jitter into the system.

In this implementation, only payload data are kept in the shared memory array, while all other control information (e.g., headers) is kept in separate arrays in the control path (e.g., in the scheduler). One advantage of this approach is that the data in the array do not need to have additional parity bits because the frames already include a CRC. In addition, because the control information is typically manipulated in some way and may vary in size, the exclusion of this information from the datapath allows data to be stored in the array in a regular and efficient manner. Moreover, in designs which mix control and payload data in a shared memory array, it is possible, at high speeds, to build up a large back log of data before the switch can determine what to do with the data. With at least some of the designs of the present invention, this is avoided because the data and control paths are maintained in parallel, i.e., payload data are introduced into the array in parallel with parsing the control information. However, despite these advantages, embodiments of the invention are contemplated in which at least some control information is stored in the array with the payload data. For example, some level of locking could be implemented in the datapath to achieve lower fall through latency.

As mentioned above, the control signals for the datapath are generated from a single control stream (referred to herein as the array control channel) by a scheduler. The scheduler queries the ports, tracks the traffic through the switch, and issues commands on the array control channel such that access to the SRAM array is interleaved fairly for all active switch ports. If any port is given too many turns at accessing the array, traffic bottlenecks can develop on other ports. Therefore, according to a specific embodiment, the scheduler attempts to schedule access to the array in cyclic order, e.g., for a 24-port switch the order would repeat 1-24. As will be discussed, a particular port may have to skip its turn if, for example, it hasn't aggregated sufficient data to transmit.

Figure 9:
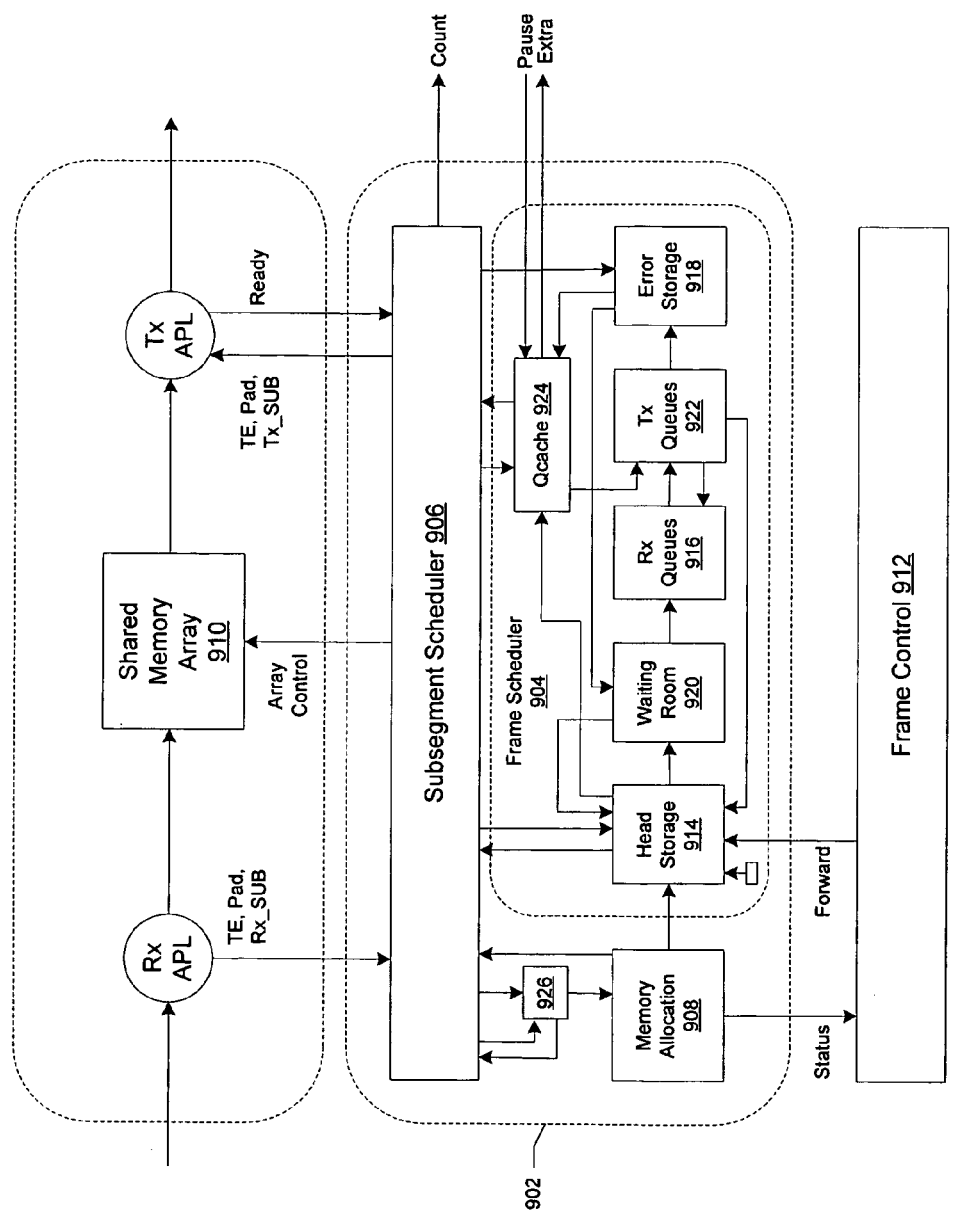
FIG. 9 is a block diagram illustrating operation of a scheduler according to a specific embodiment of the invention.

A particular implementation of a scheduler for use with embodiments of the invention will now be described with reference to FIG. 9. Scheduler 902 performs three main functions. Frame Scheduler 904 maintains and orders queues of frames to be transmitted through the datapath. According to one implementation, 100 queues (25 each for four priorities) are used. However, this number is scalable and could be considerably larger (e.g., 200, 400, etc.) with substantially the same architecture.

Frame scheduler 904 tracks information on a per frame basis regardless of the size of the frames. Once a frame has been scheduled by Frame Scheduler 904, Subsegment Scheduler 906 schedules the individual subsegments within each frame. Memory Allocation block 908 takes care of memory allocation, i.e., determining where to start storing each frame in the shared memory array 910.

Scheduler 902 receives frame control information for a particular frame from frame control 912 on the Forward channel. A portion of the frame control information is written into Head Storage 914, and the rest of which proceeds down the pipeline shown to the right of Head Storage 914. Head storage 914 is not required in all implementations, but is used in this implementation to temporarily store portions of the frame control information which are not required to effect the scheduling functions of frame scheduler 904 (e.g., VLAN tagging data). This temporarily stored information is "picked up" again later prior to the functions in which it is utilized. This results in a savings in the sizes of the SRAM arrays in each of the blocks of the Frame Scheduler pipeline. That is, if all the data were copied into blocks 916, 922, etc., it would require more total storage.

Memory Allocation block 908 maintains a "free" list of each of the 4096 256 byte segments in shared memory array 910 which are not currently in use. In response to input from Memory Allocation block 908, Head Storage 914 places its portion of the frame control information in one of 4096 slots in its own SRAM array (not shown), each slot corresponding to one of the 4096 segments in shared memory array 910. The designated slot corresponds to the location in the shared memory array in which the first segment of a frame is to be stored. If a frame is longer than one segment, Memory Allocation 908 provides a linked list of any additional segments required directly to Subsegment Scheduler 906.

The address of the frame "head" segment is the unique identifier for each frame in the system. The individual SRAM arrays (not shown) in each of Rx Queues 916, Error Storage 918, and Subsegment Scheduler 906 also have 4096 slots which have the same one-to-one correspondence with the 4096 segments in shared memory array 910.

After Head Storage 914 receives the address from Memory Allocation block 908, the frame control information not stored in the Head Storage array propagates along the Frame Scheduler pipeline along with the address information. If the frame is being transmitted in store-and-forward mode, the frame control information sits in a slot in Waiting Room 920 until notification is received that the entire frame has gotten into array 910 (e.g., as indicated by an EOF communicated from Subsegment Scheduler 906 via Error Storage 918), at which point, the frame control information is forwarded to Rx Queues 916. Waiting room has one such slot for each Rx port. If, on the other hand, the frame is being transmitted in cut-through mode, the frame control information proceeds to Rx Queues 916 without being stored in Waiting Room 920.

Rx Queues 916 and Tx Queues 922 include sets of queues in which the frame control information for each frame (referred to from this point forward simply as a "frame") is queued up to await its turn for transmission to the designated Tx port(s). The queued up frames in Rx Queues 916 include a destination mask which indicates to which port(s) the frame is to be transmitted. Rx Queues 916 is fully provisioned in that it has a slot for each of the 4096 segments in array 910, including the destination mask information.

Tx Queues 922 is maintained separate from Rx Queues 916 to facilitate multicast of frames, i.e., transmission of a frame from one Rx port to multiple Tx ports. Depending upon the approach to multicast replication chosen, different issues arise. For example, if replication occurs only after a frame reaches the head of Rx Queues 916, there is no guarantee that all of the designated Tx ports will be available. On the other hand, if replication occurs in Rx Queues, the queue array would need to be undesirably large in order to ensure that the queue is fully provisioned. Therefore, according to a specific embodiment of the invention, Tx Queues 922 is only fully provisioned for unicast. However, as will be discussed, this is more than sufficient to be able to handle a reasonable multicast requirement.

According to this embodiment, each frame in Rx Queues 916 is copied into a slot in Tx Queues 922, with multicast frames being replicated for every port to which they are to be transmitted. Each entry in Tx Queues 922 indicates the single Tx port to which the frame is to be transmitted. To fully provision Tx Queues 922 for unicast, 4096 slots are provided to correspond with the maximum number of frames which can be stored in array 910 at any given time. Unlike the array in Rx Queues 916, these 4096 slots are not indexed to the segments in array 910. As a result, Tx Queues employs its own free list to allocate its slots to incoming frames. Maintaining this free list separate from the Memory Allocation Block free list allows the multicast to be more efficient with memory. That is, only a small percentage of the frames in array 910 are likely to be multicast, so creating the second list allows a memory storage on the order of the actual multicast and not the worst case multicast.

The 4096 slots in Tx Queues 922, although only fully provisioned for unicast, actually provide sufficient space to support a significant multicast requirement because of the fact that the average frame is larger than the 256 bytes segment size in array 910. As a result, there will virtually always be many fewer than 4096 frames stored in the array at any given time. This means that a correspondingly large number of the 4096 slots in Rx Queues 916 are unused at any given time; a sufficiently high number such that even if a significant number of the frames in Rx Queues 916 need to be replicated for multicast, the 4096 slots in Tx Queues are sufficient to hold them all.

According to a specific implementation, there is a credit based flow control mechanism between Rx queues and Tx queues for the 4 fabric priorities. This allows Tx queues to reserve some space (in the corner case where we would run out of space for Tx queues because Tx queues is not fully provisioned) for higher priority multi-cast. If Tx queues were to fill up completely, then it would not result in packet drop, but the forwarding from Tx queues to Rx queues would back up, leading to a small amount of HOL blocking on multicast. This priority mechanism prevents HOL blocking of higher priority in that corner case.

According to a particular 24 port implementation (with an additional $25^{th}$ port for the CPU), frames are transmitted according to four different priorities, and Rx Queues 916 has 100 queues organized by Rx port and priority, i.e., one queue for each Rx port per priority. Tx Queues 922 also has 100 queues, but organized by Tx port and priority. Thus, for example, if Tx Queues 922 runs out of space for a given priority, multicast frames for a different priority can still be forwarded.

It should be noted that the size of Tx Queues 922 may be larger or smaller for various implementations. For example, in this implementation a 4096 slot array was chosen because it fully provisions unicast. Alternatively, additional margin against statistically unlikely events may also be provided by increasing the number of slots in Tx Queues 922. In addition, given that Rx Queues 916 is unlikely to ever be completely full, even if Tx Queues 922 becomes full due to a burst of multicast traffic, the unused slots in Rx Queues 916 would still make it unlikely that the system would stall.

When Subsegment Scheduler 906 needs a new frame for a particular Tx port, it queries Qcache 924 as to whether a frame is available for that port. Qcache 924 returns a "yes/no" answer. If the answer is "yes," Qcache 924 also transmits to Subsegment Scheduler 906 the frame control information stored in Tx Queues 922 along with the additional information originally left in Head Storage 914 when the frame entered Frame Scheduler 904. Qcache 924 is maintained separately from Tx Queues 922 in order to be able to keep up with the requests from Subsegment Scheduler 906 which may come in at speeds that Tx Queues 922 might not be able to keep up with.

According to one embodiment, the forwarding of a frame involves a request from subsegment scheduler 906, and then the forwarding of frame information stored in Tx Queues and Head storage 914. This interaction must happen at a frame rate of 360 MHz in a fully provisioned 24 port switch. However, the complexity of the computation and the interaction with large memories in 906, 914, and 922 is hard to achieve in 0.13 um CMOS. Therefore, Qcache 924 is introduced to shorten this latency loop. Qcache stores the "top of queue" for 100 queues, which equals ports times priorities. When subsegment scheduler queries Qcache, it selects the priority (see egress scheduling algorithm) and it furnishes the top of queue information to 906. Otherwise, it responds with no eligible frames on that queue, and 906 may move on two the next port. Once it has sent on this information, that queue becomes empty. This state is reported Tx Queues 922 which then arranges for the next frame in that port-priority queue to be sent to Qcache from Head Storage 914 and Error Storage 918. This effectively gives two cycles to bring information out of 914, 918, and 922, instead of just one.

According to various embodiments, the architecture of the present invention supports strict priority and weighted round robin egress scheduling algorithms. According to a specific implementation, QCache determines eligibility from Head Storage, i.e., there is a frame to send at the head of any of the port-priority queues. It receives port availability information from the Subsegment Scheduler. It maintains credit information for all of the priorities within a port. It can then calculate any of a number of different scheduling algorithms locally and efficiently. The architecture scales for many new algorithms to be added by a modest modification to Qcache.

According to a specific embodiment, egress scheduling is performed in Qcache 924 based on the egress scheduling algorithm and information from Subsegment Scheduler 906 and the per port flow control. If the frame is eligible (i.e., it is ready for transmission because the frame is to be forwarded in cut-through mode and 64 bytes of the frame have been stored in shared memory array 910, or the frame is in store-and-forward mode and the entire frame has been stored in the shared memory array) and the port is not flow controlled, then it enters the egress scheduling algorithm. Scheduling is implemented in a loop to increase the efficiency of the pipelined circuitry in Qcache 924. A large number of standard scheduling algorithms may be implemented efficiently in this architecture, for example strict priority and weighted round robin. In addition the per port flow control information could have priority information in it, enabling the switch element to respond to priority based flow control.

According to a specific embodiment, Qcache 924 has 100 slots, each for storing the frame at the head of each of the 100 queues in Tx Queues 922. That is, Qcache 924 can store up to four frames for each port, each frame having one of the four different priorities. When Subsegment Scheduler 906 requests a frame for a particular Tx port, Qcache 924 sends a frame for that port if it has one in one of the four queues for that port. When Qcache 924 empties one of its 100 queues, it sends a request to Tx Queues 922 for the next frame in the corresponding one of its 100 queues. This is a particularly scalable aspect of this architecture.

Assuming that Tx Queues 922 has a frame in that queue, it sends that entry to Qcache 924, but not directly. Rather, Tx Queues 922 sends the frame to Head Storage 914 to pick up the information for that frame stored in Head Storage 914 when the frame originally came into the scheduler. The complete frame control information is then sent to Qcache 924 for storage in the appropriate slot.

As discussed above, Subsegment Scheduler operates in a loop in which it queries the switch ports in succession as to whether each has something to transmit. According to a specific embodiment, Subsegment Scheduler 906 is explicitly disallowed to request a new frame for a particular port from Qcache 924 on successive passes through the loop. This smoothes out the burstiness in Subsegment Scheduler 906 and SRAM array 910 which would otherwise be associated with beginning a new minimum-size (i.e., 64 byte) frame on every cycle. This in turn reduces the amount of buffering required as well as the jitter caused by such bursts.

According to a specific embodiment, the entry stored in Qcache may also include error information for the frame received from Error Storage 918. The purpose of Error Storage 918 is to facilitate suppression of frames with errors when operating in store-and-forward mode. If a frame has come into the array completely, Error Storage 918 stores an error bit indicating whether the Rx port by which the frame arrived marked it with an error. This mechanism allows the error information of a frame to be propagated from the end of the frame to the beginning of the frame. This information is then used by Subsegment Scheduler 906 to facilitate suppression of the frame.

If, on the other hand, the system is operating in cut-through mode, transmission of the frame may already begun before the EOF has been received. In such a case, the error information received by Subsegment Scheduler 906 (TE in FIG. 9) is simply passed to the Tx port for egress tag processing. According to a specific embodiment, if a frame being transmitted in cut-through mode is determined to be bad, the frame's CRC may or may not be negated depending upon the nature of the error. If the error is a result of the CRC itself being bad, then the frame is allowed to go out with the same CRC. Alternatively, if the error corresponds to something else in the frame, the CRC is negated before the frame goes out, e.g., in the Tx port.

As mentioned above, the error bits stored in Error Storage 918 allow the Subsegment Scheduler to facilitate frame suppression in store-and-forward mode. However, if frame transmission begins before the EOF has been received, (e.g., as in cut-through mode), the information in Error Storage 918 should be ignored. Therefore, according to a specific embodiment, a locking mechanism is provided which detects whether Error Storage 918 is being read for a particular frame before the error bits for that frame have been written.

One way to implement such a locking mechanism is to provide an error bit and a validity bit in Error Storage 918. The validity bit would start out as invalid. When the EOF comes in with the error information, the error bit would be set accordingly and the validity bit would be set to valid to indicate that the error information is current. Then, when Subsegment Scheduler 906 reads a frame from Qcache 924, it would look at the validity bit to determine whether or not to ignore the error bit.

However, such an approach requires that the validity bit be set and then reset between frames. In the embodiment described above in which frames are being written at the equivalent of 300 MHz, the error bit is also written at the equivalent of 300 MHz and then read at the same rate. Resetting of the validity bit would also need to match this rate, posing a difficult design problem. Thus, it is desirable to avoid this additional speed requirement.

According to a particular implementation, the polarity of the validity bit is employed to determine whether the associated error information is valid. That is, each time the validity bit is used, it is toggled to the opposite state. This is then compared with the "polarity" of the frame (actually the first segment of the frame) to determine whether the error bit is valid. The polarity of the frame is represented by a polarity bit in the free list entry in Memory Allocation block 908 which corresponds to the first segment of the frame.

The free list entry for each frame also includes a second polarity bit which is employed by Subsegment Scheduler 906 to ensure that reading of subsegments does not begin before they are written to the array. According to one embodiment, the implementation of this is a straight forward locking mechanism. If for any of the 4 subsegments per each segment stored in the memory, the locking bits stored in the subsegment scheduler do not match the same polarity as was recorded in the free list, then the data have not yet been written into the array, and subsegment scheduler will wait for it before scheduling that data. By using this locking mechanism, only a few bits per frame in the subsegment scheduler need to operate at the subsegment rate. This rate is twice the frame rate, and allows the switch to perform cut-through on 64 byte subsegments, leading to a very low latency switch.

As mentioned above, Subsegment Scheduler 906 "loops through" all of the switch ports, servicing both the Rx and Tx portions of each port in turn. In a specific implementation, Subsegment Scheduler 906 includes a 4096 slot SRAM which is indexed by the 4096 segments in array 910. The array in Subsegment Scheduler 906 is organized by segment, storing linked lists of segments, padding information which indicates how many bytes are valid in the last subsegment of a segment, and a reference count, the use of which is described below.

According to some embodiments, while most of the SRAM arrays in the switch architecture are implemented as single-ported arrays, the SRAM array in Subsegment Scheduler 906 is implemented as a dual-ported SRAM to provide sufficient margin for the required read and write speeds. According to one such embodiment, the SRAM array in Subsegment Scheduler 906 is implemented as a dual-ported 10 T SRAM array as described in U.S. patent application Ser. No. 10/890,816, the entire disclosure of which is incorporated herein by reference for all purposes.

When the first subsegment of a frame comes into array 910 it is written at the segment address picked by Memory Allocation 908 and Head Storage 914. Because there is no constraint on whether the first subsegment arrives before or after the frame control information on the Forward Channel is available to Scheduler 902, the segment address allocation effected by Memory Allocation 908 and Head Storage 914 occurs one frame ahead, i.e., is "pre-allocated," for each port. That is, when the system is initialized, Memory Allocation 908 provides a beginning segment address to Head Storage 914 for each port (e.g., 25 different segment addresses for the 25 port embodiments discussed above). Head Storage 914 then provides these segment address pointers to Subsegment Scheduler 906 so that Subsegment Scheduler 906 has a starting segment allocated for each port before any frames are received. Thus, when the first subsegment for a frame is received on a particular Rx port, Subsegment Scheduler 906 can already read the pre-allocated segment address for that Rx port. When Head Storage 914 receives the frame control information on the Forward channel and uses the pre-allocated address as described above, it also gets another pre-allocated address from Memory Allocation 908 to present to Subsegment Scheduler 906 for that Rx port.

Segments in SRAM array 910 are freed for reuse (i.e., placed back in the free list in Memory Allocation 908) when their data are sent out to a Tx port. However, when segments of a particular frame are discarded, they are not sent to a Tx port, so another mechanism must be provided to free those addresses. One such mechanism uses a special discard Tx unit which spools the addresses back to the free list as if the discarded segments had been transmitted to that "port."

According to a second implementation, Head Storage 914 provides a discard bit to Subsegment Scheduler for each Rx port which indicates whether a frame received on that port is going to be discarded. This discard bit is derived from the frame control information sent on the Forward channel which includes a destination mask of all zeros. Because the first segment for a particular frame has already been allocated as described above, the first four subsegments received for a frame (regardless of whether or not the frame has been marked for discarding) are written to the allocated segment. After some number (e.g., 3 or 4) of the subsegments of the first segment have been received (providing sufficient time to allow the discard bit to be set), Subsegment Scheduler 906 reads the discard bit provided by Head Storage 914 to determine whether further segments in array 910 should be allocated for this frame. Subsegment Scheduler 906 then acknowledges this discard with a completion signal sent back to Head Storage 914. This prevents a future frame from being scheduled that would use the same address. The acknowledgement scheme prevents a race condition.

Also there is a similar locking issue with the polarity bit in Error Storage 918 as represented by the arrows from Error Storage 918 to Waiting Room, and then from Waiting Room 920 to Head Storage 914. Because the polarity bit scheme is challenging in the case of frame discard, it is important to ensure that the "wrong" polarity is written into the pointer data so that on the next frame the polarity is valid. These loops and this locking mechanism achieve this result.

If the discard bit indicates that the frame is to be discarded, no further segments are allocated for that frame. Rather, the first segment which has already been allocated is simply reused with subsequent subsegments being written over the previously received subsegments for that frame. Thus, only a single segment in array 910 gets allocated for a frame which is going to be discarded. When the writing to that segment for the frame to be discarded is complete, that segment is used as the pre-allocated segment for that port for the next frame. In this way, a separate mechanism for freeing up a segment is not required.

As mentioned above, for frames which are not discarded, the segments in array 910 used to store the subsegments of that frame are freed for reuse as the contents of each segment are transmitted to a Tx port. However, if a frame is being multicast, its segments should not be freed after transmission to a single Tx port. That is, the segments should only be freed upon transmission to the final Tx port to which the frame is being multicast. Therefore, a reference count is maintained which tracks whether the frame has been transmitted to the requisite number of Tx ports.

This count could be determined for each segment from, for example, the destination mask received by Head Storage 914 via the Forward channel. That is, each time Subsegment Scheduler 906 facilitates transmission of a particular segment to a Tx port, it could notify Memory Allocation 908 which could then decrement the count. When the reference count reached zero, Memory Allocation 908 could then return the segment to the free list.

Given the performance requirements of these circuits, implementing the reference count in this manner could be difficult for much the same reasons as discussed above with reference to the error and validity bits. This would be particularly true for the unicast case in which the reference count would need to be written twice and read once. Therefore, according to a particular implementation, advantage is taken of the fact that whenever a free segment is allocated it is known that its current reference count is at zero, i.e., in order for the segment to be on the free list, its reference count must be zero. And instead of bringing the reference count up to the ports and then decrementing by one until zero is reached, this embodiment takes advantage of modulo arithmetic and the fact that a finite-bit-size counter is employed to reach the same result.

That is, each time the contents of a segment are transmitted to a Tx port, a number is added to the reference count such that when the port count is reached, the reference count wraps back around to zero. The number added to the reference count for all but one of the ports to which a segment is transmitted is 1. The number representing transmission to the remaining port is whatever is needed to get the counter back to zero. Thus, when the number for all of the ports have been added to the reference count (i.e., when the segment has been transmitted to all of the intended ports), the count wraps around to zero, indicating that the segment may be returned to the free list. In the unicast case, the number can either be zero or, alternatively, the total count for the counter, e.g., 64 for a 6-bit counter.

The numbers to be added to the reference count are determined at the time of multicast replication between Rx Queues 916 and Tx Queues 922. That is, when Rx Queues 916 is doing the multicast replication, it determines the necessary reference count contributions with reference to the destination bit mask, and includes these numbers with the Tx Queues entries. So, for each entry in Tx Queues, there is a reference count contribution number which is provided to Subsegment Scheduler 906 via Qcache 924 as described above, and eventually to Memory Allocation 908.

A second mechanism for discarding frames will now be described. The frame discard mechanism described above relies on information received from the frame control which indicates that a frame is to be discarded. However, there are other cases in which a frame may need to be discarded that will not be indicated in the frame control information. For example, a frame may have an error as indicated by the EOF which typically does not come in before the frame control information. As described above, such an error is only made apparent when the frame entry is in Qcache 924.

In addition, the Ethernet spec imposes a time out requirement which specifies a maximum time that a frame is allowed to "live" in the switch. When that time is exceeded (e.g., as a result of a port asserting the Pause control to Qcache 924 or bursts of high priority traffic stalling lower priority traffic), the frame must be discarded. In a specific embodiment, when a frame comes into Head Storage 914, it receives a time stamp which Qcache uses to determine if any of the frames in its slots have become stale.

In any case, when it is determined that a frame in Qcache 924 should be discarded, Subsegment Scheduler 906 discards these frames.

It should be noted that segments in array 910 are typically returned to the free list in Memory Allocation 908 only after all of the subsegments have been transmitted to the Tx port. However, when a frame is discarded by this mechanism, the entire first segment which had been allocated can be discarded at once. If successive frames are discarded, this can result in segments being freed at a rate faster than that for which Memory Allocation 908 is provisioned. Therefore a FIFO 926 and throttling mechanism is provided between Subsegment Scheduler 906 and Memory Allocation 908 to deal with this condition.

When a token is sent from Subsegment Scheduler 906 to Memory Allocation 908 as a result of a successfully transmitted segment to one or more Tx ports, it is inserted into FIFO 926 unconditionally. However, when the token is being sent because a frame was discarded, Subsegment Scheduler 906 queries FIFO 926 to determine whether there is room in the FIFO to receive the token. If so, the token is transmitted to FIFO 926. If not, then Subsegment Scheduler 906 waits until the next time through the loop (i.e., the next time it is servicing the port for which the frame was originally intended) to query FIFO 926 again. This continues until FIFO 926 has room. Eventually, the token reaches Memory Allocation 908 and the corresponding segment is returned to the free list.

Memory Allocation 908 reports status information on the channel "Status" from the scheduler to frame control 912 for the processing of congestion management policies. The frame processor may use this information to centralize the computation of complex congestion management policies in an efficient manner. This further allows the forwarding information from 912 to 914 to include the results of the congestion management processing. Such processing may include, weighted random early discard, tail discard, the generation of Tx (or egress) pause signals to neighboring switches, the generation of explicit congestion notification, either forward or backward, and other forms of congestion management. While the memory allocation of shared memory array 910 uses 256 Byte segments, the status may be reported based on any other fundamental segment size. For example one implementation uses a 1024 byte segment size to reduce the event rate of the status channel.

According to some implementations, frames are associated with multiple logical queues. Each queue does not need reserved physical memory, and a frame may be associated with multiple queues provided that 1) the ingress crossbar is non-blocking, 2) the congestion management calculations are applied while the frames are stored in the shared memory, and 3) ordering is maintained for data within a frame by the linked list, and 4) for frames within each egress scheduling queue by 922 and 924. All of these conditions are required to allow multiple queue association in the specific implementation shown.

Associating the frames with multiple queues allows a rich set of congestion management processing without any replication of data in shared memory 910. In one possible implementation, a new frame is associated with an Rx Port on ingress through the crossbar, a Tx port once the forwarding information has been received from 912, and with the total memory. Frame control 912 may contain many watermarks for congestion management processing against which the status information is checked. In particular, it may include a notion of a private allocation for each port, and then create a "shared pool" value as the total memory minus the sum of each port's private memory. Rx port status above the Rx private watermark contributes to the shared pool, and then it contributes the difference.

Another implementation could generate status information based on the priority with which each frame is associated, and use that for congestion management processing based on either port priority or a global priority as well, that is the sum of every port's packets of the same priority within the switch.

While the invention has been particularly shown and described with reference to specific embodiments thereof, it will be understood by those skilled in the art that changes in the form and details of the disclosed embodiments may be made without departing from the spirit or scope of the invention. For example, embodiments of the invention have been described herein with reference to the Ethernet specification. However, it will be understood that the basic principles of the invention may be employed to implement switch fabric architectures in a variety of contexts. That is, the present invention may be implemented for virtually any protocol or interconnect technology including, for example, Ethernet, Serial Rapid I/O, Advanced Switching, any streaming protocol (e.g., TDM, SPI-4), any higher layer protocol (e.g., TCP/IP), and any application tunneling one protocol over another (e.g., Hypertransport over Ethernet).

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A shared memory, comprising:
   a plurality of receive ports characterized by a maximum port data rate;
   a plurality of transmit ports characterized by the maximum port data rate;

a memory array comprising a plurality of memory banks, operation of the memory array being characterized by a second data rate;

non-blocking receive crossbar circuitry configured to connect any of the receive ports with any of the memory banks;

non-blocking transmit crossbar circuitry configured to connect any of the memory banks with any of the transmit ports;

buffering configured to decouple operation of the receive and transmit ports at the maximum port data rate from operation of the memory array at the second data rate; and scheduling circuitry configured to control interaction of the ports, crossbar circuitry, and memory array to effect storage and retrieval of frames of data in the shared memory, each of the frames of data comprising one or more data segments, each of the data segments comprising a plurality of data bytes, wherein the scheduling circuitry is configured in a store-and-forward mode to sequentially query the plurality of ports for the frames of data, arbitrate among a subset of the ports having the frames of data to assign a first starting location in a first one of the memory banks during a first cycle to a first data segment of a first frame received on a first one of the ports, facilitate storage of equal portions of the data bytes of the first data segment at the first starting location during the first cycle and corresponding locations in successive memory banks following the first memory bank on successive cycles, and facilitate storage of equal portions of the data bytes of each subsequent data segment of the first frame at corresponding locations in the first and successive memory banks until storage of the first frame is complete, such that the shared memory is fully provisioned for all of the ports simultaneously operating at the maximum port data rate.

2. The shared memory of claim 1 wherein operation of the receive and transmit crossbar circuitry is characterized by a third data rate, and wherein the buffering includes first buffers between each receive port and the receive crossbar circuitry, and second buffers between each transmit port and the transmit crossbar circuitry, the first and second buffers being configured to decouple operation of the receive and transmit ports at the maximum port data rate from operation of the receive and transmit crossbar circuitry at the third data rate.

3. The shared memory of claim 2 wherein each of the first buffers are configured to store an entire segment of a frame.

4. The shared memory of claim 2 wherein each of the second buffers accounts for all jitter through the shared memory.

5. The shared memory of claim 1 wherein operation of the receive and transmit crossbar circuitry is characterized by a third data rate, and wherein the buffering includes first buffers between the receive crossbar circuitry and each of the memory banks, and second buffers between the transmit crossbar circuitry and each of the memory banks, the first and second buffers being configured to decouple operation of the memory array at the second data rate from operation of the receive and transmit crossbar circuitry at the third data rate.

6. The shared memory of claim 1 wherein the scheduling circuitry is configured to control the receive crossbar circuitry to transmit each successive word of each data segment via successive output ports of the receive crossbar circuitry.

7. The shared memory of claim 6 wherein an arbitration decision is made by the receive crossbar circuitry only once per data segment.

8. The shared memory of claim 1 wherein the scheduling circuitry is configured to control the transmit crossbar circuitry to receive each successive word of each data segment via successive input ports of the transmit crossbar circuitry.

9. The shared memory of claim 8 wherein an arbitration decision is made by the transmit crossbar circuitry only once per data segment.

10. The shared memory of claim 1 wherein the scheduling circuitry is configured to assign each starting location for each frame either pseudo-randomly or deterministically.

11. The shared memory of claim 10 wherein assigning each starting location for each frame is done deterministically, the starting locations being selected in a linear order.

12. The shared memory of claim 10 wherein assigning each starting location for each frame is done deterministically, the starting locations being selected according to a least-recently-allocated algorithm.

13. The shared memory of claim 1 wherein each of the receive crossbar circuitry and the transmit crossbar circuitry comprises a plurality of crossbars arranged in a plurality of stages.

14. The shared memory of claim 13 wherein the plurality of crossbars of the receive crossbar circuitry comprises a plurality of input crossbars, and wherein each of the receive ports of the shared memory is associated with one of the input crossbars.

15. The shared memory of claim 14 wherein the plurality of input crossbars comprises two input crossbars of equal size, and wherein half of the receive ports is associated with each of the input crossbars.

16. The shared memory of claim 13 wherein the plurality of crossbars of the transmit crossbar circuitry comprises a plurality of output crossbars, and wherein each of the transmit ports of the shared memory is associated with one of the output crossbars.

17. The shared memory of claim 16 wherein the plurality of output crossbars comprises two output crossbars of equal size, and wherein half of the transmit ports is associated with each of the output crossbars.

18. The shared memory of claim 13 wherein the receive crossbar circuitry comprises at least one input crossbar having an input associated with each of the receive ports and an output associated with each of a plurality of subsets of the memory banks in the memory array, the receive crossbar circuitry further comprising a plurality of subset crossbars, each of which is associated with at least one of the subsets of memory banks in the memory array and is configured to connect at least one of the input crossbar outputs with the memory banks in the associated subset.

19. The shared memory of claim 13 wherein the transmit crossbar circuitry comprises at least one output crossbar having an output associated with each of the transmit ports and an input associated with each of a plurality of subsets of the memory banks in the memory array, the transmit crossbar circuitry further comprising a plurality of subset crossbars, each of which is associated with at least one of the subsets of memory banks in the memory array and is configured to connect at least one of the output crossbar inputs with the memory banks in the associated subset.

20. The shared memory of claim 1 further comprising receive port logic associated with each receive port which is configured to separate control information from the data segments for use by the scheduling circuitry in effecting storage of the data segments in the memory array.

21. The shared memory of claim 20 further comprising transmit port logic associated with each transmit port which is configured to recombine the control information with the data segments for transmission on the associated transmit port.

22. The shared memory of claim 20 wherein the control information comprises all control information associated with the data segments, and wherein only payload data associated with the data segments are stored in the memory array.

23. The shared memory of claim 20 wherein at least some of the control information is stored in the memory array along with payload data associated with the data segments.

24. The shared memory of claim 23 wherein the control information encodes a length for the associated data segment, and includes an end-of-frame bit and an error bit.

25. The shared memory of claim 1 further comprising frame control circuitry which is configured to provide frame level processing for each of the frames, wherein the receive and transmit crossbar circuitry, the memory array, at least some of the buffering, the scheduling circuitry, a first portion of each of the receive and transmit ports, and a first portion of the frame control circuitry comprise asynchronous circuitry which operates in an asynchronous domain, and wherein a remaining portion of each of the receive and transmit ports, and a remaining portion of the frame control circuitry comprise synchronous circuitry which operates in a synchronous domain.

26. The shared memory of claim 25 wherein the synchronous circuitry of the shared memory enables the shared memory to operate as a synchronous block in a synchronous system.

27. The shared memory of claim 1 wherein each data segment comprises one or more sub-segments, and wherein the scheduling circuitry is configured to facilitate egress scheduling for the first frame in a cut-through mode of operation in response to storage of a first sub-segment of the first data segment of the first frame.

28. The shared memory of claim 27 wherein each data segment comprises 256 bytes, each equal portion of the data bytes comprises four data bytes, and each sub-segment comprises 64 bytes.

29. The shared memory of claim 1 wherein the scheduling circuitry is configured to facilitate processing of frames of variable length.

30. The shared memory of claim 29 wherein the scheduling circuitry is configured to facilitate operation of the shared memory in each of the store-and-forward mode and a cut-through mode.

31. The shared memory of claim 1 wherein the scheduling circuitry is configured to facilitate storage of the first data segment to the memory array and retrieval of a second data segment from the memory array substantially simultaneously, the first and second data segments being unrelated.

32. The shared memory of claim 31 wherein the scheduling circuitry is configured to generate independent control streams for the receive and transmit crossbar circuitry.

33. The shared memory of claim 32 wherein each of the receive and transmit crossbar circuitry comprises two independent crossbars, one of the independent control streams being associated with each.

34. The shared memory of claim 1 wherein the receive crossbar circuitry comprises a plurality of input channels and a plurality of output channels, and wherein the transmit crossbar circuitry comprises a plurality of input channels and a plurality of output channels, the scheduling circuitry being configured to serialize control data for the input channels of the receive crossbar circuitry and the output channels of the transmit crossbar circuitry, and to parallelize control data for the output channels of the receive crossbar circuitry and the input channels of the transmit crossbar circuitry.

35. The shared memory of claim 1 wherein the buffering includes an egress buffer associated with each of the transmit ports, each transmit port being configured to wait to receive data segments of a second frame from the associated egress buffer until a particular number of the data segments of the second frame have been stored in the egress buffer.

36. The shared memory of claim 35 wherein the particular number is determined with reference to the maximum port data rate.

37. The shared memory of claim 35 wherein each transmit port is also configured to begin receiving the data segments of the second frame when one of the data segments stored in the associated egress buffer indicates an end of the second frame.

38. A switch having a switching protocol associated therewith, the switch comprising a shared memory, the shared memory comprising:
   a plurality of receive ports characterized by a maximum port data rate;
   a plurality of transmit ports characterized by the maximum port data rate;
   a memory array comprising a plurality of memory banks, operation of the memory array being characterized by a second data rate;
   non-blocking receive crossbar circuitry configured to connect any of the receive ports with any of the memory banks;
   non-blocking transmit crossbar circuitry configured to connect any of the memory banks with any of the transmit ports;
   buffering which is configured to decouple operation of the receive and transmit ports at the maximum port data rate from operation of the memory array at the second data rate; and
   scheduling circuitry which is configured to control interaction of the ports, crossbar circuitry, and memory array to effect storage and retrieval of frames of data in the shared memory, each of the frames of data comprising one or more data segments, each of the data segments comprising a plurality of data bytes, wherein the scheduling circuitry is configured in a store-and-forward mode to sequentially query the plurality of ports for the frames of data, arbitrate among a subset of the ports having the frames of data to assign a first starting location in a first one of the memory banks during a first cycle to a first data segment of a first frame received on a first one of the ports, facilitate storage of equal portions of the data bytes of the first data segment at the first starting location during the first cycle and corresponding locations in successive memory banks following the first memory bank on successive cycles, and facilitate storage of equal portions of the data bytes of each subsequent data segment of the first frame at corresponding locations in the first and successive memory banks until storage of the first frame is complete, such that the shared memory is fully provisioned for all of the ports simultaneously operating at the maximum port data rate.

39. The switch of claim 38 wherein the switching protocol comprises Ethernet.

* * * * *